United States Patent
Nagai et al.

(10) Patent No.: US 9,891,404 B2
(45) Date of Patent: Feb. 13, 2018

(54) POLYMER DEVICE, METHOD OF MANUFACTURING THE SAME, LENSE MODULE, AND IMAGING UNIT

(71) Applicant: Dexerials Corporation, Tokyo (JP)

(72) Inventors: Nobuyuki Nagai, Kanagawa (JP); Takehisa Ishida, Kanagawa (JP); Yusaku Kato, Kanagawa (JP); Hideo Kawabe, Saitama (JP); Masayoshi Morita, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 474 days.

(21) Appl. No.: 14/253,565

(22) Filed: Apr. 15, 2014

(65) Prior Publication Data

US 2014/0320988 A1    Oct. 30, 2014

(30) Foreign Application Priority Data

Apr. 26, 2013 (JP) .................. 2013-093429

(51) Int. Cl.
| | |
|---|---|
| *H01L 41/09* | (2006.01) |
| *G02B 7/09* | (2006.01) |
| *H01L 41/047* | (2006.01) |
| *H01L 41/083* | (2006.01) |
| *H01L 41/193* | (2006.01) |

(Continued)

(52) U.S. Cl.
CPC ............ *G02B 7/09* (2013.01); *H01L 41/0471* (2013.01); *H01L 41/083* (2013.01); *H01L 41/094* (2013.01); *H01L 41/193* (2013.01); *H01L 41/22* (2013.01); *H01L 41/27* (2013.01); *Y10T 29/42* (2015.01)

(58) Field of Classification Search
CPC ........ B06B 1/0603; H01L 41/083; H03H 9/08
USPC ........ 310/307, 328, 300, 331, 332, 364, 800
See application file for complete search history.

(56) References Cited

U.S. PATENT DOCUMENTS

| | | | |
|---|---|---|---|
| 7,733,000 B2 * | 6/2010 | Kudoh .................... | F03G 7/005 204/242 |
| 2005/0006989 A1 * | 1/2005 | Wallace ................... | A61F 2/08 62/440 |

(Continued)

FOREIGN PATENT DOCUMENTS

| | | |
|---|---|---|
| CN | 102759786 | 10/2012 |
| JP | 2007-158588 A | 6/2007 |
| JP | 2013-038956 | 2/2013 |

OTHER PUBLICATIONS

Notification of Reasons for Refusal (with English translation) dated Feb. 7, 2017 in corresponding Japanese application No. 2013-093429 (9 pages).

(Continued)

*Primary Examiner* — Bryan Gordon
(74) *Attorney, Agent, or Firm* — K&L Gates LLP

(57) ABSTRACT

A polymer device includes: a pair of electrode layers; a polymer layer inserted between the pair of electrode layers; and an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

22 Claims, 17 Drawing Sheets

(51) Int. Cl.
*H01L 41/22* (2013.01)
*H01L 41/27* (2013.01)

(56) References Cited

U.S. PATENT DOCUMENTS

| | | | | |
|---|---|---|---|---|
| 2007/0122132 | A1* | 5/2007 | Misawa | G02B 27/646 396/55 |
| 2010/0171393 | A1* | 7/2010 | Pei | H01L 41/094 310/330 |
| 2010/0244633 | A1* | 9/2010 | Nagai | H01B 1/122 310/364 |
| 2011/0200907 | A1* | 8/2011 | Moon | H01B 1/122 429/455 |
| 2012/0032564 | A1* | 2/2012 | Takahashi | B81B 3/0021 310/348 |
| 2012/0326564 | A1* | 12/2012 | Takahashi | F03G 7/005 310/328 |
| 2013/0093287 | A1* | 4/2013 | Biso | F03G 7/005 310/330 |

OTHER PUBLICATIONS

Chinese Office Action dated Jul. 25, 2017 in corresponding Chinese Application No. 201410158464.5.

\* cited by examiner

POLYMER DEVICE, METHOD OF MANUFACTURING THE SAME, LENSE MODULE, AND IMAGING UNIT

CROSS REFERENCES TO RELATED APPLICATIONS

The present application claims priority to Japanese Priority Patent Application JP 2013-093429 filed in the Japan Patent Office on Apr. 26, 2013, the entire content of which is hereby incorporated by reference.

BACKGROUND

The present disclosure relates to a polymer device in which a polymer layer is inserted between a pair of electrode layers, to a method of manufacturing the polymer device, and to a lens module and an imaging unit that use the polymer device.

In recent years, high functionality of mobile electronic apparatuses such as a mobile phone, a personal computer (PC), and a personal digital assistant (PDA) has been significantly promoted, and such mobile electronic apparatuses generally include an imaging function by mounting a lens module. In such a mobile electronic apparatus, a lens in the lens module is allowed to travel along an optical axis thereof, and thereby, a focusing operation and a zooming operation are performed.

In the past, as a method of moving a lens in a lens module, a method using a voice coil motor, a stepping motor, or the like as a drive section has been generally used. In contrast, recently, in terms of miniaturization, an apparatus utilizing a predetermined actuator device as a drive section has been developed. Examples of such an actuator device may include a polymer actuator device (see Japanese Unexamined Patent Application Publication No. 2013-38956). In the polymer actuator device, a polymer layer (such as an ion-exchange resin film) is sandwiched between a pair of electrode layers. In such a polymer actuator device, since a difference in electric potential is caused between the pair of electrode layers, the ion-exchange resin film is displaced in a direction perpendicular to the film surface.

SUMMARY

In general, in a polymer device including such a polymer actuator device, change of shape (change of dimensions) occurs due to change of surrounding environment. Further, in such a polymer device, it is also important to prevent deformation characteristics (curvature characteristics) thereof from being lowered (to retain the deformation characteristics (the curvature characteristics)). Therefore, it is desired that a polymer device in which change of shape resulting from environmental change is allowed to be suppressed while the deformation characteristics are retained be proposed.

It is desirable to provide a polymer device in which change of shape resulting from environmental change is allowed to be suppressed while the deformation characteristics are retained, a method of manufacturing the polymer device, a lens module, and an imaging unit.

According to an embodiment of the present disclosure, there is provided a polymer device including: a pair of electrode layers; a polymer layer inserted between the pair of electrode layers; and an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

According to an embodiment of the present disclosure, there is provided a method of manufacturing a polymer device, the method including: forming a pair of electrode layers; providing a polymer layer between the pair of electrode layers; and arranging an expansion-contraction suppression layer between the pair of electrode layers and away from the respective electrode layers, the expansion-contraction suppression layer being configured to suppress expansion and contraction of the polymer layer.

According to an embodiment of the present disclosure, there is provided a lens module including: a lens; and a drive unit configured with use of a polymer device, and the drive unit being configured to drive the lens. The polymer device includes: a pair of electrode layers; a polymer layer inserted between the pair of electrode layers; and an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

According to an embodiment of the present disclosure, there is provided an imaging unit including: a lens; an imaging device configured to obtain an imaging signal of an image formed by the lens; and a drive unit configured with use of a polymer device, and the drive unit being configured to drive one of the lens and the imaging device. The polymer device includes: a pair of electrode layers; a polymer layer inserted between the pair of electrode layers; and an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

In the polymer device, the method of manufacturing the polymer device, the lens module, and the imaging unit according to the above-described embodiments of the present disclosure, by providing the expansion-contraction suppression layer suppressing expansion and contraction of the polymer layer, change of shape of the polymer device resulting from change of environment is suppressed. Further, since the expansion-contraction suppression layer is arranged away from the respective electrode layers, deformation movement of the polymer device is less likely to be prevented (inhibition of deformation movement by existence of the expansion-contraction suppression layer is suppressed).

According to the polymer device, the method of manufacturing the polymer device, the lens module, and the imaging unit according to the above-described embodiments of the present disclosure, since the expansion-contraction suppression layer is arranged away from the respective electrode layers, deformation movement of the polymer device is allowed to be less likely to be prevented while expansion and contraction of the polymer layer is suppressed. Therefore, while deformation characteristics are retained, change of shape resulting from change of environment is allowed to be suppressed.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

An embodiment of the present disclosure will be described in detail below with reference to the drawings. The description will be given in the following order.

1. Embodiment (an example of a case using a polymer device as an actuator device or a sensor device)
2. Modifications
Modifications 1 to 5 (Other configuration examples of an expansion-contraction suppression layer)
3. Application Examples
Application example 1 (an example of application to an imaging unit including a drive unit driving a lens)
Application example 2 (an example of application to an imaging unit including a drive unit driving an imaging device)
4. Other modifications Embodiment Configuration of Polymer Device 1

Figure 1:
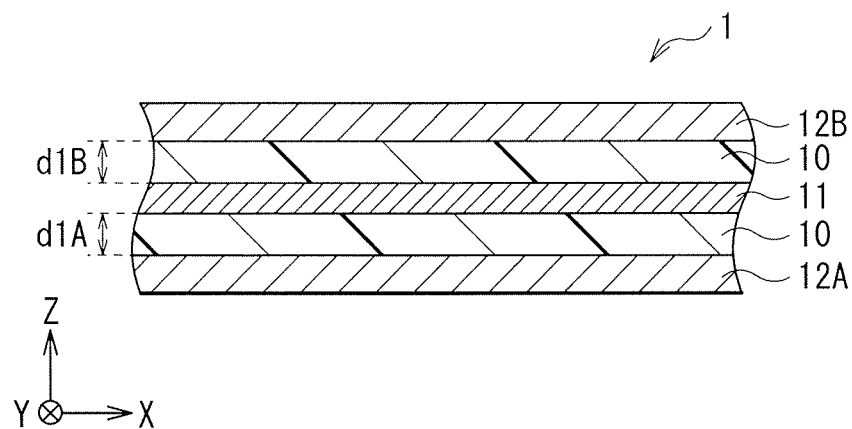
FIG. 1 is a cross-sectional view illustrating a configuration example of a polymer device according to an embodiment of the present disclosure.
Figure 2:
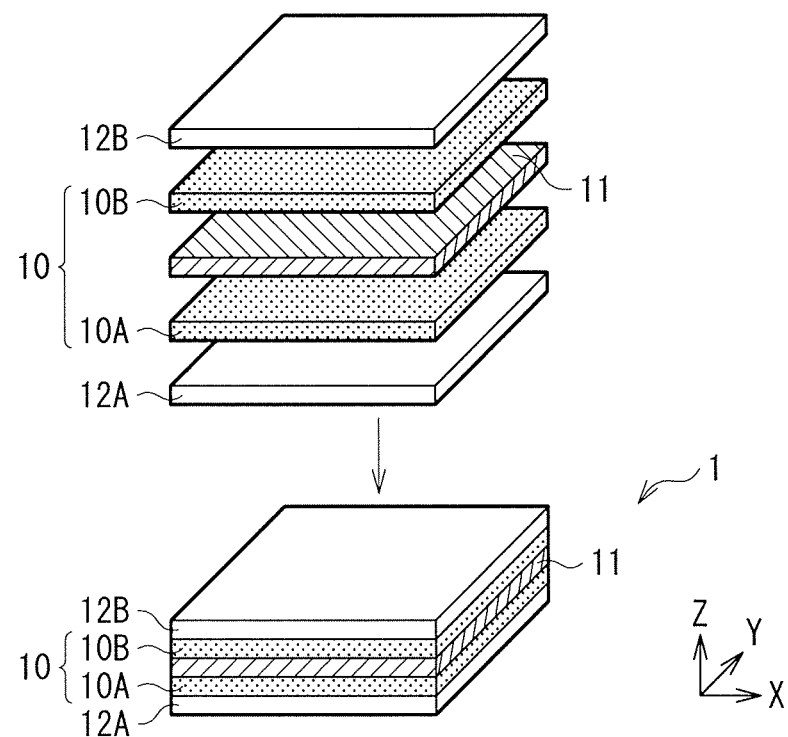
FIG. 2 is a perspective view schematically illustrating a laminated structure of the polymer device illustrated in FIG. 1.

FIG. 1 illustrates a cross-sectional configuration example (a Z-X cross-sectional configuration example) of a polymer device (a polymer device 1) according to an embodiment of the present disclosure. Further, FIG. 2 schematically illustrates a laminated structure in the polymer device 1 by a perspective view and an exploded perspective view. As described later, the polymer device 1 may serve, for example, as a polymer actuator device, a polymer sensor device, or the like.

The polymer device 1 has a cross-sectional structure including a pair of electrode layers 12A and 12B arranged on both surfaces of a polymer layer 10, and an expansion-contraction suppression layer 11 arranged in the polymer layer 10. In other words, the polymer device 1 has the pair of electrode layers 12A and 12B and the polymer layer 10 and the expansion-contraction suppression layer 11 that are inserted between the electrode layers 12A and 12B. It is to be noted that surroundings of such a polymer device 1 may be covered with an insulting protective film made of a material (such as polyurethane) having high elasticity.

[Polymer Layer 10]

The polymer layer 10 may be formed, for example, of an ion electrically-conductive polymer compound film impregnated with an ion substance. The foregoing term "ion substance" refers to general ions capable of being conducted through the polymer layer 10. Specifically, the foregoing term "ion substance" refers to: a substance containing hydrogen ions, simple substances of metal ions, or any of the foregoing cations and/or anions and a polar solvent; or a substance containing cations and/or anions in a state of liquid in itself such as imidazolium salt. Examples of the former may include a substance obtained by solvating a polar solvent with cations and/or anions. Examples of the latter may include an ionic liquid.

Examples of a material configuring the polymer layer 10 may include an ion-exchange resin having a fluorine resin, a hydrocarbon system, or the like as a skeleton. As the ion-exchange resin, a cation exchange resin may be preferable in the case where the polymer layer 10 is impregnated with a cation substance, and an anion exchange resin may be preferable in the case where the polymer layer 10 is impregnated with an anion substance.

Examples of the cation exchange resin may include a resin in which an acid group such as a sulfonate group and a carboxyl group is introduced. Specific examples thereof may include polyethylene having an acid group, polystyrene having an acid group, and a fluorine resin having an acid group. In particular, as the cation exchange resin, a fluorine resin having a sulfonate group or a carboxylic group may be preferable. Examples thereof may include Nafion (available from Du Pont Kabushiki Kaisha).

As the cation substance with which the polymer layer 10 is impregnated, any type such as an organic cation substance and an inorganic cation substance may be used. For example, applicability is available for various forms such as simple substances of metal ions, a material containing metal ions and water, a material containing organic cations and water, and an ionic liquid. Examples of the metal ions may include light metal ions such as sodium ions (Na+), potassium ions (K+), lithium ions (Li+), and magnesium ions (Mg2+). Further, examples of the organic cations may include alkyl ammonium ions. Such cations exist as hydrate in the polymer layer 10. Therefore, in the case where the polymer layer 10 is impregnated with a cation substance containing cations and water, the polymer device 1 may be preferably sealed as a whole in order to suppress volatilization of water.

The ionic liquid is also called an ambient temperature molten salt, and contains cations and anions that have low combustibleness and low volatilization characteristics. Examples of the ionic liquid may include an imidazolium-ring-system compound, a pyridinium-ring-system compound, and an aliphatic-system compound.

In particular, the cation substance may be preferably the ionic liquid, since the ionic liquid has low volatilization characteristics, and thereby, the polymer device 1 operates favorably even in high-temperature atmosphere or in vacuum.

[Electrode Layers 12A and 12B]

The respective electrode layers 12A and 12B contain one or more electrically-conductive materials. Each of the electrode layers 12A and 12B may be preferably formed by bonding powder particles of the electrically-conductive materials to one another by ion electrically-conductive polymers, since thereby, flexibility of the electrode layers 12A and 12B is improved. As the electrically-conductive material powder, carbon powder may be preferable. One reason for this is that, since the carbon powder has high electrical conductivity and a large specific surface, a larger deformation amount is obtained thereby. As the carbon powder, Ketjen black may be preferable. As the ion electrically-conductive polymer, a material similar to the foregoing constituent material of the polymer layer 10 may be preferable.

The electrode layers 12A and 12B may be formed, for example, as follows. That is, both surfaces of the polymer layer 10 are coated with a coating material in which electrically-conducive material powder and an ion electrically-conductive polymer are dispersed in a dispersion medium, and subsequently, the coating material is dried. Alternatively, the electrode layers 12A and 12B may be formed by pressure-bonding a film-like material containing electrically-conducive material powder and an ion electrically-conductive polymer to both surfaces of the polymer layer 10.

The electrode layers 12A and 12B may have a laminated structure. In this case, each of the electrode layers 12A and 12B may preferably have a structure in which a layer in which powder particles of the electrically-conductive material are bonded to one another by ion electrically-conductive polymers and a metal layer are laminated in order from the polymer layer 10. Thereby, in an in-plane direction of the electrode layers 12A and 12B, electric potential comes close to a more uniform value, and more superior deformation performance is obtained. Examples of a material configuring the metal layer may include precious metal such as gold and platinum. Although the thickness of the metal layer may be arbitrary, the metal layer may be preferably a continuous film so that an electric potential becomes uniform in the electrode layers 12A and 12B. Examples of methods of forming the metal layer may include a plating method, an evaporation method, and a sputtering method.

[Expansion-Contraction Suppression Layer 11]

The expansion-contraction suppression layer 11 is a layer having a function (such as a function to suppress volume-change rate of the polymer layer 10 to a value less than 5%) to suppress expansion and contraction in a layer direction (in an in-plane direction) in the polymer layer 10. The expansion-contraction suppression layer 11 is located between the pair of electrode layers 12A and 12B, and is arranged away from the respective electrode layers 12A and 12B. Specifically, in this example, the expansion-contraction suppression layer 11 is arranged in the vicinity of the center in a thickness direction in the polymer layer 10. That is, a separation distance d1A from the electrode layer 12A to the expansion-contraction suppression layer 11 and a separation distance d1B from the electrode layer 12B to the expansion-contraction suppression layer 11 are substantially equal to each other (d1A≈d1B), or may be desirably equal to each other (d1A=d1B). In other words, in this example, the polymer device 1 has a symmetrical structure (a vertically symmetrical structure) in the thickness direction.

Further, in this example, the expansion-contraction suppression layer 11 is arranged in the whole formation region of the polymer layer 10 (in an X-Y plane). Therefore, as illustrated in FIG. 2, the polymer layer 10 is divided into a polymer layer 10A on the electrode layer 12A side and a polymer layer 10B on the electrode layer 12B side. In other words, a laminated structure in which the polymer layer 10A, the expansion-contraction suppression layer 11, and the polymer layer 10B are laminated in order from the electrode layer 12A is inserted between the electrode layers 12A and 12B. It is to be noted that the thickness of the expansion-contraction suppression layer 11 may be, for example, about one third of the thickness of the whole laminated structure or less. The respective thicknesses (corresponding to the foregoing separation distances d1A and d1B) of the polymer layers 10A and 10B may be, for example, equal to or larger than 10 μm.

The expansion-contraction suppression layer 11 is made of a material having lower linear expansion coefficient and lower area expansion rate (=(area in a moisture state/area in a dry state−1)×100) and higher Young's modulus compared to the polymer layer 10. Specifically, the expansion-contraction suppression layer 11 is made of a material having linear expansion coefficient of a value from about 10×10-6 to about 50×10-6 (/deg C.) both inclusive, area expansion rate of a value from about 0 to about 5(%) both inclusive, and Young's modulus of a value from about 1 to about 10 (GPa) both inclusive. In contrast, the polymer layer 10 is made of a material having linear expansion coefficient of about 100×10-6 (/deg C.), area expansion rate of a value equal to or larger than 10(%), and Young's modulus of a value from about 0.2 to about 0.5 (GPa) both inclusive. Further, the expansion-contraction suppression layer 11 may be preferably made of a material having ion conductivity as described later. Such an expansion-contraction suppression layer 11 may be formed of a fibrous film or a porous film having voids that are impregnated with an ion-conductive resin. Specifically, as the expansion-contraction suppression layer 11, for example, a material such as glass paper (a fibrous film in a state, for example, a paper made from glass fibers having, for example, porosity of 80% or higher), glass flake (scale-like glass), aramid fiber, polyester fiber, cellulose, acryl fiber, fluorine resin fiber, and polyolefin fiber; or an arbitrary combination thereof may be used.

[Method of Manufacturing Polymer Device 1]

The polymer device 1 according to this embodiment may be manufactured, for example, as follows. That is, first, the pair of electrode layers 12A and 12B made of the foregoing material are each formed by the foregoing method. Further, the respective polymer layers 10A and 10B made of the foregoing material are formed.

Further, for example, as illustrated in FIG. 2, the foregoing fibrous film (such as glass paper) or the foregoing porous film is impregnated with an ion-conductive resin, and thereby, the expansion-contraction suppression layer 11 is formed. It is to be noted that, instead of the foregoing method, for example, the expansion-contraction suppression layer 11 may be formed by dispersing a material (a material having lower linear expansion coefficient and higher Young's modulus compared to the polymer layers 10A and 10B) that has an expansion-contraction function in an ion conductive resin.

Subsequently, the respective layers of the electrode layers 12A and 12B, the polymer layers 10A and 10B, and the expansion-contraction suppression layer 11 that are formed as above are laminated in the order of lamination illustrated in FIG. 2. That is, the polymer layers 10A and 10B are arranged between the pair of electrode layers 12A and 12B, the expansion-contraction suppression layer 11 is arranged between the polymer layers 10A and 10B, and the expansion-contraction suppression layer 11 is arranged between the pair of electrode layers 12A and 12B and is arranged away from the respective electrode layers 12A and 12B. Accordingly, the polymer device 1 illustrated in FIG. 1 and FIG. 2 is completed. It is to be noted that the polymer device 1 may be manufactured by a method other than the foregoing lamination method, for example, by repeated coating (repetition of coating, drying, and curing) of the respective layers.

[Function and Effect of Polymer Device 1]

[A. Basic Operation in Case of Serving as Polymer Actuator Device]

In the polymer device 1 according to this embodiment, in the case where a predetermined difference in electric potential is generated between the electrode layers 12A and 12B, deformation (curvature) occurs in the polymer layer 10 based on the following principle. That is, in this case, the polymer device 1 serves as a polymer actuator device.

Figure 3A:
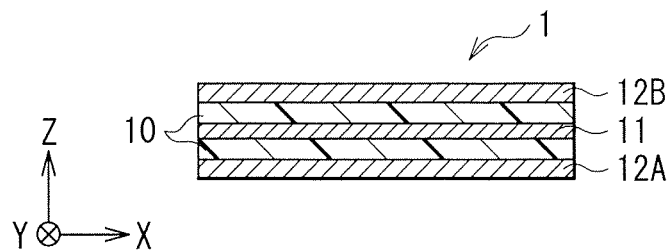
FIG. 3A is a schematic cross-sectional view for explaining a basic operation of the polymer device.
Figure 3B:
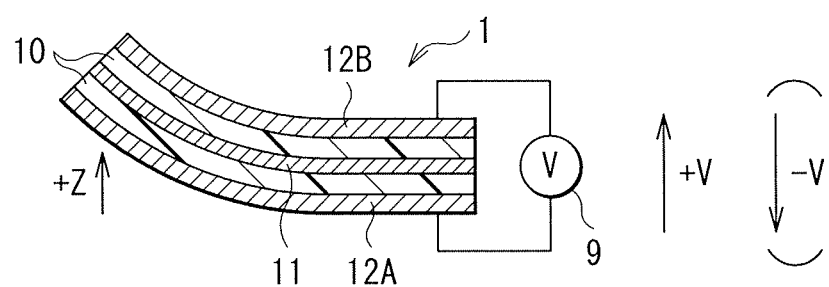
FIG. 3B is another schematic cross-sectional view for explaining a basic operation of the polymer device.
Figure 3C:
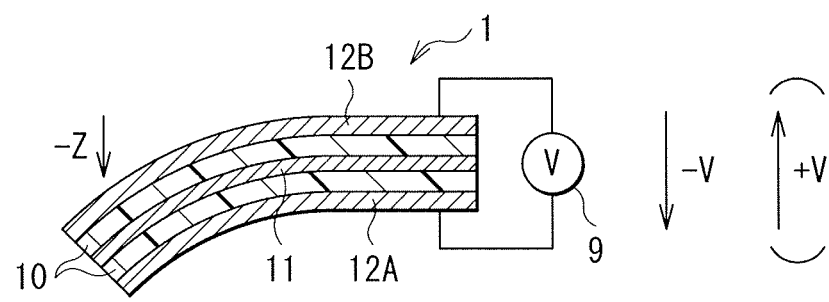
FIG. 3C is still another schematic cross-sectional view for explaining a basic operation of the polymer device.

FIG. 3A, FIG. 3B, and FIG. 3C schematically illustrate operation (operation as the polymer actuator device) of the polymer device 1 using cross-sectional views (Z-X cross-sectional views). Referring to FIG. 3A, FIG. 3B, and FIG. 3C, description will be given below of operation of the polymer device 1 as the polymer actuator device for respective cases according to types of the foregoing cation substances with which the polymer layer 10 is impregnated.

First, description will be given below of a case using a substance containing cations and a polar solvent as the cation substance.

In this case, the polymer device 1 in a state of not being applied with a voltage is not curved but is planar, since the cation substance is dispersed in the polymer layer 10 substantially uniformly (FIG. 3A). In the case where a voltage is applied (application of a driving voltage Vd is started) by a voltage function section 9 (in this case, a voltage supply section) illustrated in FIG. 3B, the polymer device 1 shows the following behavior. That is, for example, in the case where a predetermined driving voltage Vd is applied between the electrode layers 12A and 12B so that the electrode layer 12A has a negative electric potential and the electrode layer 12B has a positive electric potential (see an arrow "+V" in FIG. 3B), cations are moved to the electrode layer 12A side in a state that the cations are solvated with the polar solvent. At this time, since anions are less likely to be moved in the polymer layer 10, the electrode layer 12A side is swollen and the electrode layer 12B side is shrunk in the polymer layer 10. Thereby, as a whole, the polymer device 1 is curved to the electrode layer 12B side as indicated by an arrow "+Z" in FIG. 3B.

Thereafter, the difference in electric potential between the electrode layers 12A and 12B is eliminated to obtain a state where a voltage is not applied (application of the driving voltage Vd is stopped). Thereby, the cation substance (cations and the polar solvent) that has been unbalancedly-located on the electrode layer 12A side in the polymer layer 10 is diffused, and the state illustrated in FIG. 3A is returned.

Further, in the case where the predetermined driving voltage Vd is applied between the electrode layers 12A and 12B so that the electrode layer 12A has a positive electric potential and the electrode layer 12B has a negative electric potential from the state where a voltage is not applied illustrated in FIG. 3A (see an arrow "−V" in FIG. 3C), the following behavior is shown. That is, cations are moved to the electrode layer 12B side in a state that the cations are solvated with the polar solvent. In this case, in the polymer layer 10, the electrode layer 12A side is shrunk and the electrode layer 12B side is swollen. Thereby, as a whole, the polymer device 1 is curved to the electrode layer 12A side as indicated by an arrow "−Z" in FIG. 3C.

It is to be noted that, in this case, again, in the case where the difference in electric potential between the electrode layers 12A and 12B is eliminated to obtain a state where a voltage is not applied, the cation substance that has been unbalancedly-located on the electrode layer 12B side in the polymer layer 10 is diffused, and the state illustrated in FIG. 3A is returned.

Next, description will be given of a case using an ionic liquid containing liquid cations as the cation substance.

Also in this case, in a state where a voltage is not applied, since the ion liquid is dispersed in the polymer layer 10 substantially uniformly, the polymer device 1 is planar as illustrated in FIG. 3A. In the case where a voltage is applied by the voltage function section 9 (the voltage supply section), the polymer device 1 shows the following behavior. That is, for example, in the case where a predetermined driving voltage Vd is applied between the electrode layers 12A and 12B so that the electrode layer 12A has a negative electric potential and the electrode layer 12B has a positive electric potential, out of the ionic liquid, cations are moved to the electrode layer 12A side, and anions are not allowed to be moved in the polymer layer 10 as a cation exchange film. Therefore, the electrode layer 12A side is swollen and the electrode layer 12B side is shrunk in the polymer layer 10. Thereby, as a whole, the polymer device 1 is curved to the electrode layer 12B side as indicated by the arrow "+Z" in FIG. 3B.

Thereafter, in the case where the difference in electric potential between the electrode layers 12A and 12B is eliminated to obtain a state where a voltage is not applied, the cations that have been unbalancedly located on the electrode layer 12A side in the polymer layer 10 are diffused, and the state illustrated in FIG. 3A is returned.

Further, in the case where a predetermined driving voltage Vd is applied between the electrode layers 12A and 12B so that the electrode layer 12A has a positive electric potential and the electrode layer 12B has a negative electric potential from the state where a voltage is not applied illustrated in FIG. 3A, out of the ionic liquid, cations are moved to the electrode layer 12B side. In this case, in the polymer layer 10, the electrode layer 12A side is shrunk and the electrode layer 12B side is swollen. Thereby, as a whole, the polymer device 1 is curved to the electrode layer 12A side as indicated by the arrow "−Z" in FIG. 3C.

It is to be noted that, also in this case, in the case where the difference in electric potential between the electrode layers 12A and 12B is eliminated to obtain a state where a voltage is not applied, cations that have been unbalancedly located on the electrode layer 12B side in the polymer layer 10 are diffused, and the state illustrated in FIG. 3A is returned.

[B. Basic Operation in Case of Serving as Polymer Sensor Device]

Further, in the polymer device 1 according to this embodiment, in reverse, in the case where the polymer layer 10 is deformed (curved) in a direction orthogonal to the thickness direction (in this case, in a Z-axis direction), a voltage (an electromotive force) is generated between the electrode layer 12A and the electrode layer 12B based on the following principle. That is, in this case, the polymer device 1 serves as a polymer sensor device (such as a speed sensor and an acceleration sensor). Referring to FIG. 3A, FIG. 3B, and FIG. 3C, description will be given below of operation of the polymer device 1 as a polymer sensor device for respective cases according to types of the cation substances in a manner similar to that in the foregoing description.

First, description will be given of a case using a substance containing cations and a polar solvent as the cation substance.

In this case, first, for example, in the case where the polymer device 1 itself is not in linear motion or rotation motion, and acceleration and angular acceleration are not generated, forces resulting from the acceleration and the angular acceleration are not applied to the polymer device 1.

Therefore, the polymer device 1 is not deformed (curved), and is planar (FIG. 3A). Therefore, since a cation substance is dispersed in the polymer layer 10 substantially uniformly, a difference in electric potential is not generated between the electrode layers 12A and 12B, and a voltage detected in the polymer device 1 becomes 0 (zero) V.

In contrast, for example, in the case where the polymer device 1 itself is in linear motion or rotation motion and thereby acceleration or angular acceleration is generated, a force resulting from the acceleration or the angular acceleration is applied to the polymer device 1. Therefore, the polymer device 1 is deformed (curved) (FIG. 3B and FIG. 3C).

For example, as illustrated in FIG. 3B, in the case where the polymer device 1 is deformed in a positive direction on the Z-axis (to the electrode layer 12B side), in the polymer layer 10, the electrode layer 12B side is shrunk and the electrode layer 12A side is swollen. In this case, cations are moved to the electrode layer 12A side in a state that the cations are solvated with the polar solvent. Therefore, while the cations become dense on the electrode layer 12A side, the cations become sparse on the electrode layer 12B side. Therefore, in this case, in the polymer device 1, a voltage V having a higher electric potential on the electrode layer 12A side than on the electrode layer 12B side is generated. That is, in this case, as indicated by an arrow "−V" in parentheses in FIG. 3B, a negative voltage (−V) is detected in the voltage function section 9 (in this case, a voltmeter) connected to the electrode layers 12A and 12B.

In contrast, as illustrated in FIG. 3C, in the case where the polymer device 1 is deformed in a negative direction (to the electrode layer 12A side) on the Z-axis, in the polymer layer 10, the electrode layer 12A side is shrunk and the electrode layer 12B side is swollen by contraries. In this case, cations are moved to the electrode layer 12B side in a state that the cations are solvated with the polar solvent. Therefore, while the cations become dense on the electrode layer 12B side, the cations become sparse on the electrode layer 12A side. Therefore, in this case, in the polymer device 1, a voltage V having a higher electric potential on the electrode layer 12B side than on the electrode layer 12A side is generated. That is, in this case, as indicated by an arrow "+V" in parentheses in FIG. 3C, a positive voltage (+V) is detected in the voltage function section 9 (the voltmeter) connected to the electrode layers 12A and 12B.

Next, description will be given of a case using an ionic liquid containing liquid cations as the cation substance.

In this case, first, for example, in the case where the polymer device 1 itself is not in linear motion or rotation motion, and acceleration and angular acceleration are not generated, the polymer device 1 is not deformed, and is planar (FIG. 3A). Therefore, since the ionic liquid is dispersed in the polymer layer 10 substantially uniformly, a difference in electric potential is not generated between the electrode layers 12A and 12B, and a voltage detected in the polymer device 1 becomes 0 V.

In contrast, for example, in the case where the polymer device 1 itself is in linear motion or rotation motion and thereby acceleration or angular acceleration is generated, the polymer device 1 is deformed (FIG. 3B and FIG. 3C) in a manner similar to that in the foregoing case.

For example, as illustrated in FIG. 3B, in the case where the polymer device 1 is deformed in a positive direction (to the electrode layer 12B side) on the Z-axis, in the polymer layer 10, the electrode layer 12B side is shrunk and the electrode layer 12A side is swollen. In this case, in the case where the polymer layer 10 is a cation exchange film, cations configuring the ionic liquid are allowed to be moved through the film to the electrode layer 12A side; however anions are blocked by a functional group and are not allowed to be moved. Therefore, in this case, in the polymer device 1, a voltage V having a higher electric potential on the electrode layer 12A side than on the electrode layer 12B side is generated. That is, also in this case, as indicated by the arrow "−V" in parentheses in FIG. 3B, a negative voltage (−V) is detected in the voltage function section 9 (the voltmeter) connected to the electrode layers 12A and 12B.

In contrast, as illustrated in FIG. 3C, in the case where the polymer device 1 is deformed in a negative direction (to the electrode layer 12A side) on the Z-axis, in the polymer layer 10, the electrode layer 12A side is shrunk and the electrode layer 12B side is swollen in reverse. In this case, out of the ionic liquid, cations are moved to the electrode layer 12B side for a reason similar to the foregoing reason. Therefore, in this case, in the polymer device 1, a voltage V having a higher electric potential on the electrode layer 12B side than on the electrode layer 12A side is generated. That is, in this case, as indicated by the arrow "+V" in parentheses in FIG. 3C, a positive voltage (+V) is detected in the voltage function section 9 (the voltmeter) connected to the electrode layers 12A and 12B.

[C. Function of Expansion-Contraction Suppression Layer 11]

Figure 4:
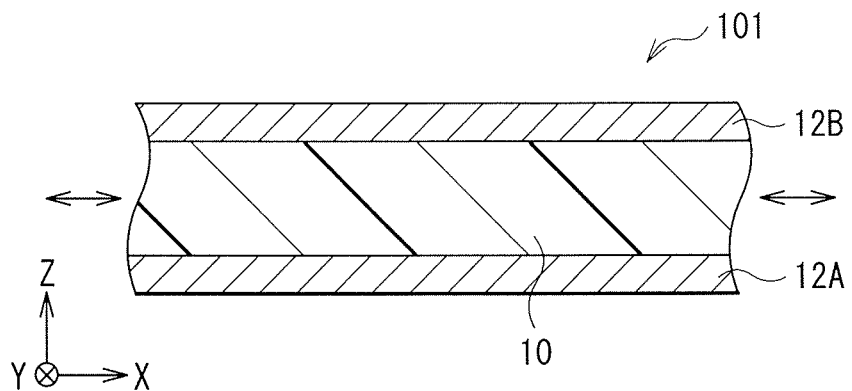
FIG. 4 is a cross-sectional view illustrating a configuration of a polymer device according to Comparative example 1.
Figure 5:
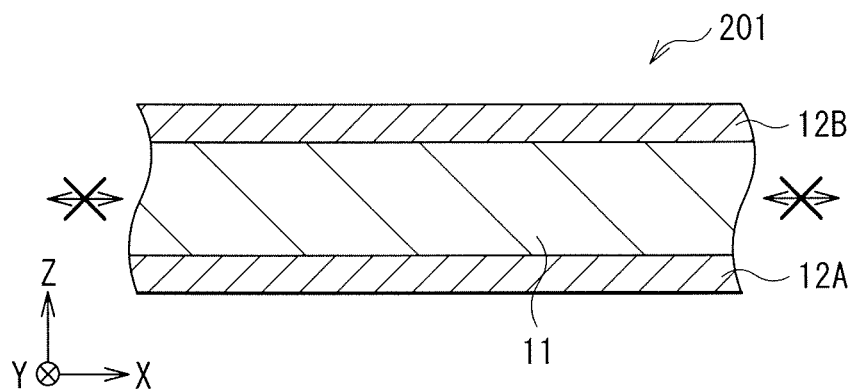
FIG. 5 is a cross-sectional view illustrating a configuration of a polymer device according to Comparative example 2.

Subsequently, detailed description will be given of a function of the expansion-contraction suppression layer 11 in the polymer device 1 according to this embodiment by comparison with comparative examples (Comparative examples 1 and 2). FIG. 4 illustrates a cross-sectional configuration (a Z-X cross-sectional configuration) of a polymer device (a polymer device 101) according to Comparative example 1. FIG. 5 illustrates a cross-sectional configuration (a Z-X cross-sectional configuration) of a polymer device (a polymer device 201) according to Comparative example 2.

Comparative Example 1

First, in the polymer device 101 according to Comparative example 1 illustrated in FIG. 4, the expansion-contraction suppression layer 11 is not provided, unlike in the polymer device 1 according to this embodiment. Therefore, in the polymer device 101, change of shape (change of dimensions) occurs due to change of surrounding environment (change in temperature, change in humidity, and/or the like). Specifically, as indicated by arrows in FIG. 4, the polymer layer 10 expands or contracts along an in-layer direction (in this example, in the X-Y in-plane direction) due to change of surrounding environment. As a result, characteristics (such as deformation characteristics) as the whole polymer device 101 are degraded.

Comparative Example 2

In contrast, in the polymer device 201 according to Comparative example 2 illustrated in FIG. 5, the expansion-contraction suppression layer 11 is provided between the pair of electrode layers 12A and 12B, unlike in the foregoing polymer device according to Comparative example 1 described above. Therefore, in the polymer device 201, change of shape resulting from change of surrounding environment is suppressed compared to in the polymer device 101. Specifically, as indicated by arrows and cross marks in FIG. 5, expansion and contraction along the in-layer direction of the polymer layer 10 resulting from change of surrounding environment is suppressed. As a result, degradation of deformation characteristics and the like as the whole polymer device 201 is suppressed.

However, in the polymer device 201, the expansion-contraction suppression layer 11 exists in the whole space between the pair of electrode layers 12A and 12B, unlike in the polymer device 1 according to this embodiment. That is, in the polymer device 201, the expansion-contraction suppression layer 11 is not arranged away from the respective electrode layers 12A and 12B, and is in contact with the respective electrode layers 12A and 12B, unlike in the polymer device 1 in which the expansion-contraction suppression layer 11 is located between the pair of electrode layers 12A and 12B and is arranged away from the respective electrode layers 12A and 12B. Therefore, in the polymer device 201, although change of shape resulting from change of surrounding environment is allowed to be suppressed, deformation movement (curvature movement) as main movement of the polymer device 201 is prevented. Specifically, since the expansion-contraction suppression layer 11 exists in the whole space between the pair of electrode layers 12A and 12B, expansion and contraction of the electrode layers 12A and 12B are excessively suppressed, and deformation movement of the polymer device 201 is inhibited. As described above, also in Comparative example 2, deformation characteristics and the like as the whole polymer device 201 are degraded.

Present Embodiment

In contrast, in the polymer device 1 according to the present embodiment, as illustrated in FIG. 1 and FIG. 2, first, as in the foregoing Comparative example 2, the expansion-contraction suppression layer 11 is provided between the pair of electrode layers 12A and 12B. Therefore, in the polymer device 1, as in the polymer device 201, change of shape resulting from change of surrounding environment is suppressed. Specifically, as indicated by arrows and cross marks in FIG. 6, expansion and contraction along in the in-layer direction of the polymer layer 10 resulting from change of surrounding environment is suppressed. As a result, degradation of deformation characteristics and the like as the whole polymer device 1 is suppressed.

Further, in the polymer device 1, as described above, the expansion-contraction suppression layer 11 is located between the pair of electrode layers 12A and 12B, and is arranged away from the respective electrode layers 12A and 12B, unlike in the foregoing polymer device 201 according to the foregoing Comparative example 2. Thereby, in the polymer device 1, deformation movement of the polymer device 1 is less likely to be prevented compared to in the polymer device 201 (inhibition of deformation movement by existence of the expansion-contraction suppression layer 11 is suppressed). In other words, since the expansion-contraction suppression layer 11 is arranged away from the respective electrode layers 12A and 12B, influence, on expansion and contraction, of the electrode layers 12A and 12B is decreased, and the polymer device 1 is easily deformed (curved).

Figure 6:
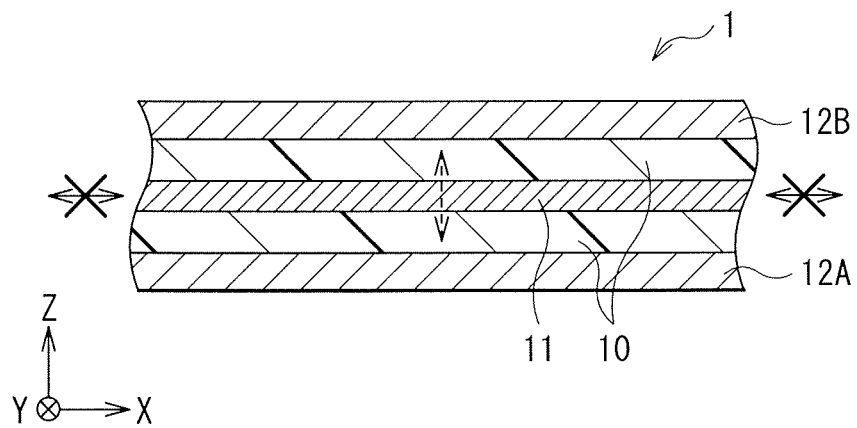
FIG. 6 is a schematic cross-sectional view for explaining a function of the polymer device illustrated in FIG. 1.

Further, in the case where the expansion-contraction suppression layer 11 has ion conductivity, as indicated by the dashed arrow in FIG. 6, inhibition of ion movement in the polymer layer 10 is decreased or avoided. Therefore, in this case, degradation of deformation characteristics and the like as the whole polymer device 1 is further suppressed.

As described above, in this embodiment, since the expansion-contraction suppression layer 11 suppressing expansion and contraction of the polymer layer 10 is arranged away from the respective electrode layers 12A and 12B, deformation movement of the polymer device 1 is allowed to be less likely to be prevented while expansion and contraction of the polymer layer 10 is suppressed. Therefore, while deformation characteristics are retained, change of shape resulting from change of environment is allowed to be suppressed.

Further, since the expansion-contraction suppression layer 11 is arranged in the vicinity of the center in the thickness direction in the polymer layer 10, warpage of the polymer layer 10 (warpage to the electrode layer 12A side or to the electrode layer 12B side) in a static state (at the time of non-deformation movement) is allowed to be prevented.

EXAMPLE

Next, description will be given of a specific example in this embodiment by comparison with comparative examples (Comparative examples 1 and 3). Respective conditions of Example and Comparative examples 1 and 3 are as follows.

Figure 7:
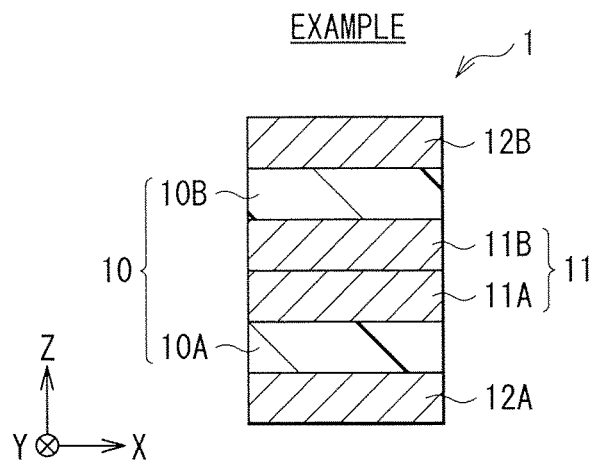
FIG. 7 is a schematic cross-sectional view illustrating a configuration example of a polymer device according to Example.

Example: FIG. 7

Electrode layers 12A and 12B: carbon powder (concentration: 40 wt %), film thickness: 25 µm
Polymer layer 10 and expansion-contraction suppression layer 11: using Nafion (registered trademark) as a base material.
Expansion-contraction suppression layers 11A and 11B: containing glass paper (porosity: 90%, glass fiber diameter: 1 µm), each film thickness: 25 µm
Polymer layers 10A and 10B: not containing glass paper (porosity: 90%, glass fiber diameter: 1 µm), each film thickness: 25 µm
Expansion-contraction suppression layers 11A and 11B are arranged away from the respective electrode layers 12A and 12B.

Figure 8:
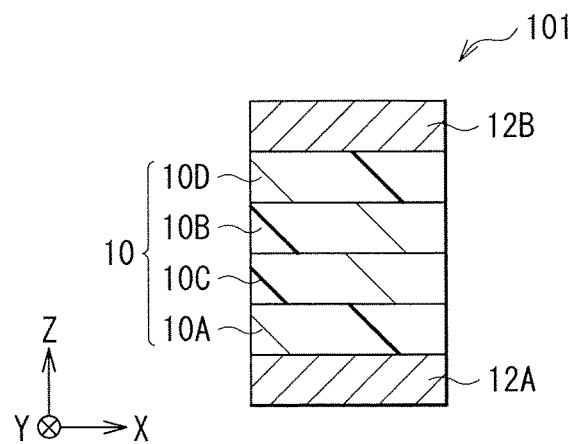
FIG. 8 is a schematic cross-sectional view illustrating a configuration example of the polymer device according to Comparative example 1.

Comparative Example 1: FIG. 8

Electrode layers 12A and 12B: carbon powder (concentration: 40 wt %), film thickness: 25 µm
Polymer layers 10A to 10D: using Nafion (registered trademark) as a base material, not containing glass paper (porosity: 90%, glass fiber diameter: 1 µm), each film thickness: 25 µm
The expansion-contraction suppression layer 11 is not included.

Figure 9:
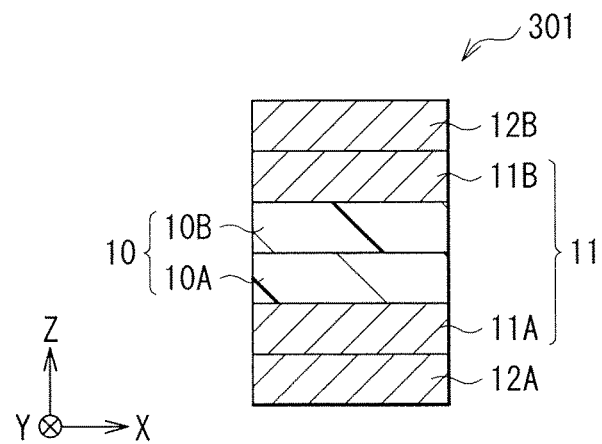
FIG. 9 is a schematic cross-sectional view illustrating a configuration example of a polymer device according to Comparative example 3.

Comparative Example 3: FIG. 9

Electrode layers 12A and 12B: carbon powder (concentration: 40 wt %), film thickness: 25 µm
Polymer layer 10 and expansion-contraction suppression layer 11: using Nafion (registered trademark) as a base material.
Expansion-contraction suppression layers 11A and 11B: containing glass paper (porosity: 90%, glass fiber diameter: 1 µm), each film thickness: 25 µm
Polymer layers 10A and 10B: not containing glass paper (porosity: 90%, glass fiber diameter: 1 µm), each film thickness: 25 µm
Expansion-contraction suppression layers 11A and 11B are in contact with the respective electrode layers 12A and 12B.

Figure 10:
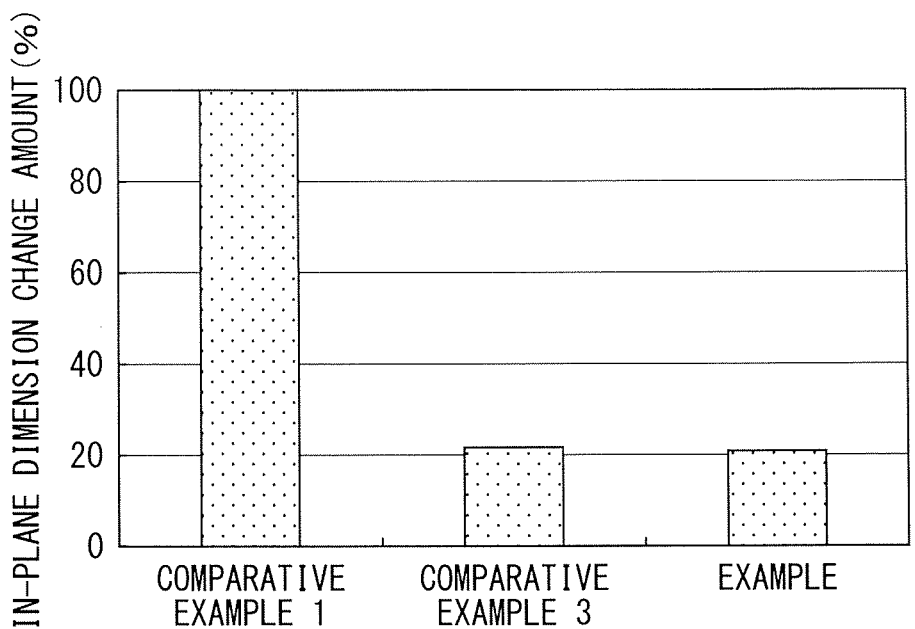
FIG. 10 is a characteristic diagram illustrating in-plane dimension change amounts according to Example and Comparative examples 1 and 3.

FIG. 10 illustrates in-plane dimension change amounts (dimension change amounts in the X-Y plane) of the polymer layer 10 in the polymer devices 1 and 101 and a polymer device 301 according to Example and Comparative examples 1 and 3, respectively. As can be seen from FIG. 10, in Example and Comparative example 3 in which the expansion-contraction suppression layer 11 is provided, the in-plane dimension change amounts are decreased by about one fifth compared to in Comparative example 1 in which the expansion-contraction suppression layer 11 is not provided. That is, it was confirmed that change of shape resulting from change of surrounding environment is suppressed by providing the expansion-contraction suppression layer 11 between the pair of electrode layers 12A and 12B.

Figure 11:
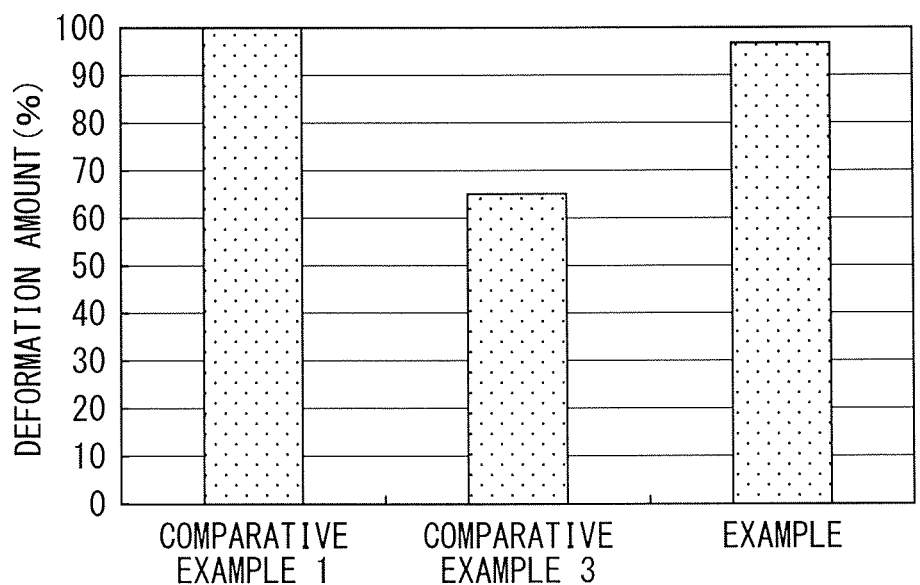
FIG. 11 is a characteristic diagram illustrating deformation amounts according to Example and Comparative examples 1 and 3.

Further, FIG. 11 illustrates deformation amounts (curvature amounts along the Z-axis direction) of the polymer layer 10 in the respective polymer devices 1, 101, and 301 according to Example and Comparative examples 1 and 3, respectively. As can be seen from FIG. 11, in Example in which the expansion-contraction suppression layers 11A and 11B are arranged away from the respective electrode layers 12A and 12B, the deformation amount is increased by about 1.5 times of the deformation amount in Comparative example 3 in which the expansion-contraction suppression layers 11A and 11B are arranged in contact with the respective electrode layers 12A and 12B. Further, it can be seen that, in Example, the deformation amount substantially equal to that of Comparative example 1 not provided with the expansion-contraction suppression layer 11 itself is obtained. That is, it was confirmed that, by arranging the expansion-contraction suppression layer 11 away from the respective electrode layers 12A and 12B, deformation movement of the polymer device 1 is less likely to be prevented (inhibition of deformation movement resulting from existence of the expansion-contraction suppression layer 11 is suppressed), and deformation characteristics substantially equal to those in the case where the expansion-contraction suppression layer 11 does not exist are retained.

[Modifications]

Subsequently, description will be given of modifications (Modifications 1 to 5) of the foregoing embodiment. In the following description, for the same components as those of the embodiment, the same referential symbols are affixed thereto, and description thereof will be omitted as appropriate.

[Modification 1]

Figure 12:
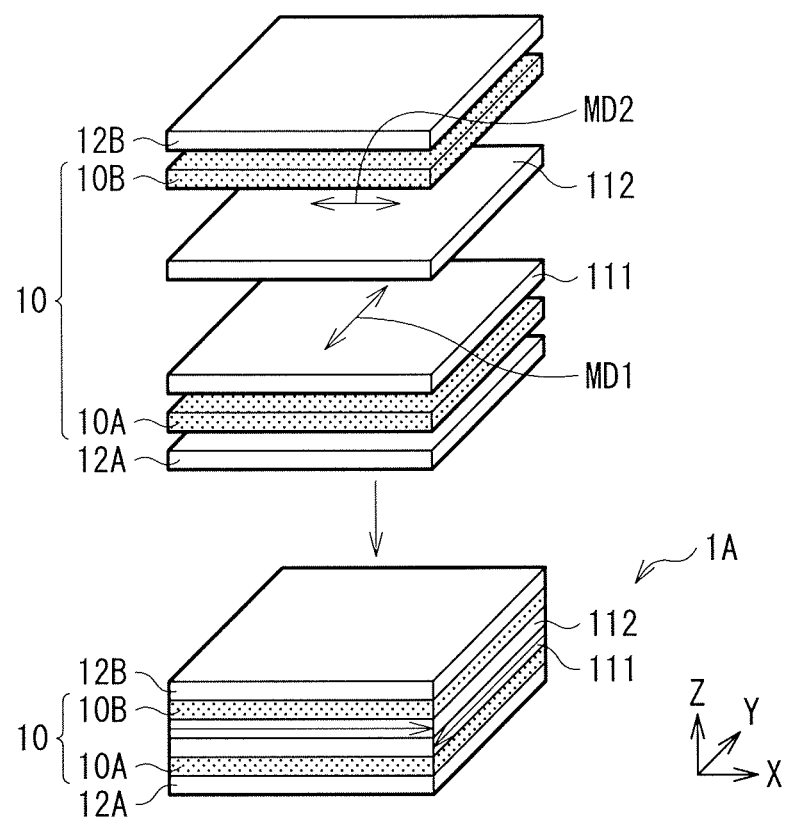
FIG. 12 is a perspective view schematically illustrating a configuration example of a polymer device according to Modification 1.

FIG. 12 schematically illustrates a configuration example of a polymer device (a polymer device 1A) according to Modification 1 by a perspective view and an exploded perspective view. The polymer device 1A of this modification corresponds to a case in which the expansion-contraction suppression layer 11 has a laminated structure of a plurality of layers (in this example, two layers), and a plurality of types of expansion-contraction suppression directions are provided in the polymer device 1 of the foregoing embodiment. For other configurations, the polymer device 1A has configurations similar to those of the polymer device 1.

Specifically, in the polymer device 1A, the expansion-contraction suppression layer 11 has a two-layer laminated structure of an expansion-contraction suppression layer 111 on the electrode layer 12A side and an expansion-contraction suppression layer 112 on the electrode layer 12B side. Further, as the whole laminated structure of the expansion-contraction suppression layers 111 and 112, a plurality of types (in this example, two types) of high expansion-contraction suppression directions in which expansion-contraction suppression function is relatively large are provided. More specifically, a high expansion-contraction suppression direction MD1 is along a Y-axis direction in the expansion-contraction suppression layer 111, and a high expansion-contraction suppression direction MD2 is along an X-axis direction in the expansion-contraction suppression layer 112. That is, the high expansion-contraction suppression directions MD1 and MD2 are orthogonal to each other in the X-Y plane. As the whole laminated structure of the expansion-contraction suppression layers 111 and 112, the two types of the high expansion-contraction suppression directions MD1 and MD2 are substantially isotropic. It is to be noted that the foregoing term "high expansion-contraction suppression direction" refers to, in other words, a direction having relatively large tensile strength, and coincides with a machine direction upon forming the respective expansion-contraction suppression layers.

In this modification having the foregoing configuration, similar effects are also obtainable basically by a function similar to that of the foregoing embodiment.

[Modification 2]

Figure 13:
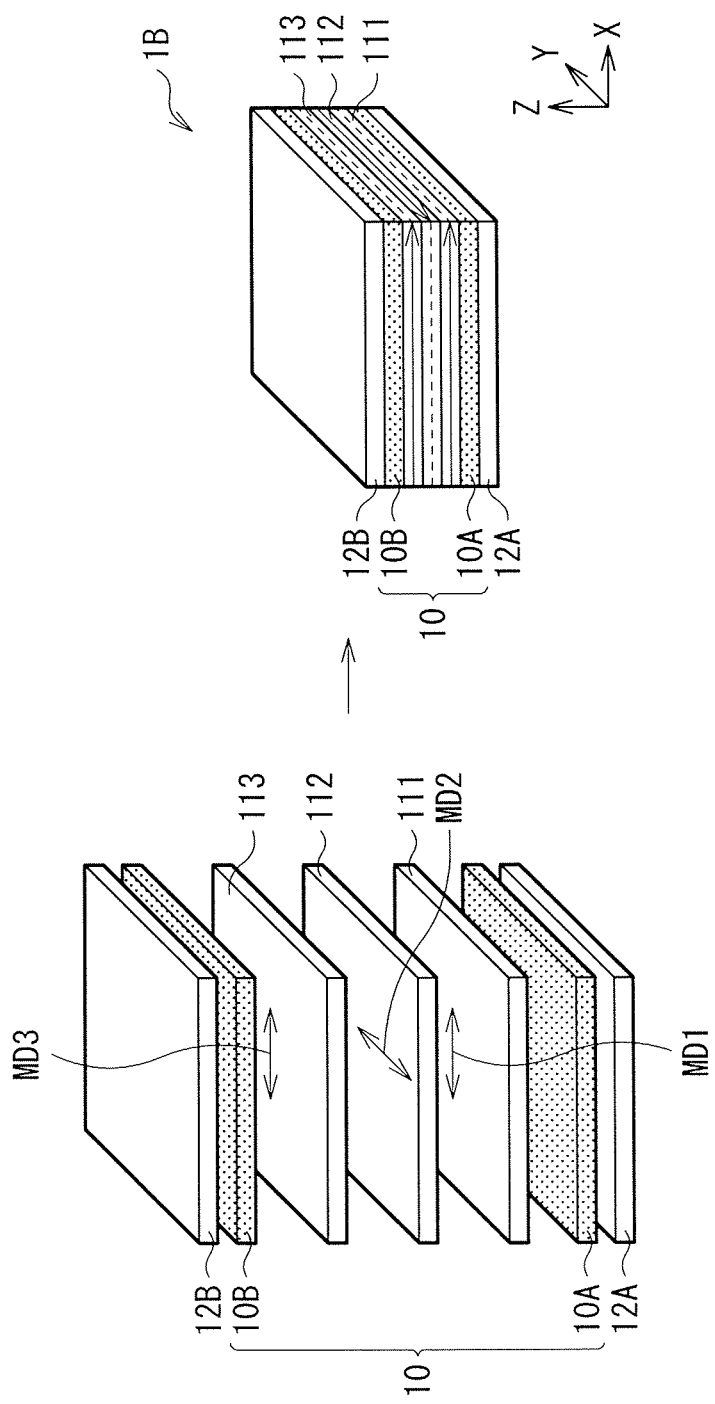
FIG. 13 is a perspective view schematically illustrating a configuration example of a polymer device according to Modification 2.

FIG. 13 schematically illustrates a configuration example of a polymer device (a polymer device 1B) according to Modification 2 by a perspective view and an exploded perspective view. As in the foregoing Comparative example 1, the polymer device 1B of this modification corresponds to a case in which the expansion-contraction suppression layer 11 has a laminated structure of a plurality of layers (in this example, three layers), and a plurality of types of expansion-contraction suppression directions are provided in the polymer device 1 of the embodiment. For other configurations, the polymer device 1B has configurations similar to those of the polymer device 1.

However, unlike in the polymer device 1A, in the polymer device 1B, an outside layer and a middle layer in the laminated structure of three or more layers (in this example, three layers) have different high expansion-contraction suppression directions described above.

Specifically, in the polymer device 1B, the expansion-contraction suppression layer 11 has a three-layer laminated structure of the expansion-contraction suppression layer 111 (an outside layer) on the electrode layer 12A side, an expansion-contraction suppression layer 113 (an outside layer) on the electrode layer 12B side, and the expansion-contraction suppression layer 112 (a middle layer) located between the expansion-contraction suppression layers 111 and 113. Further, as the whole laminated structure of the expansion-contraction suppression layers 111, 112, and 113, a plurality of types (in this example, two types) of high expansion-contraction suppression directions in which expansion-contraction suppression function is relatively large are provided. More specifically, the high expansion-contraction suppression direction MD1 and a high expansion-contraction suppression direction MD3 are each along the X-axis direction in the expansion-contraction suppression layers 111 and 113, and the high expansion-contraction suppression direction MD2 is along the Y-axis direction in the expansion-contraction suppression layer 112. That is, as described above, the high expansion-contraction suppression directions MD1 and MD3 in the expansion-contraction suppression layers 111 and 113 as the outside layers are different from the high expansion-contraction suppression direction MD2 in the expansion-contraction suppression layer 112 as the middle layer (in this example, the high expansion-contraction suppression directions MD1 and MD3 are orthogonal to the high expansion-contraction suppression direction MD2 in the X-Y plane). It is to be noted that, a direction of a dashed line illustrated in FIG. 13 indicates a low expansion-contraction suppression direction (a direction orthogonal to the high expansion-contraction suppression direction in the X-Y plane) having relatively small expansion-contraction suppression function, and the same is applied in the following description.

Figure 14A:
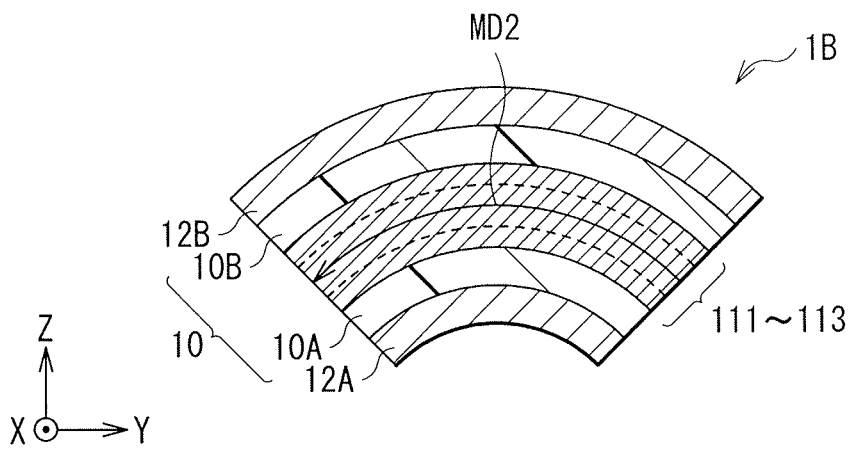
FIG. 14A is a schematic cross-sectional view for explaining a function of the polymer device illustrated in FIG. 13.
Figure 14B:
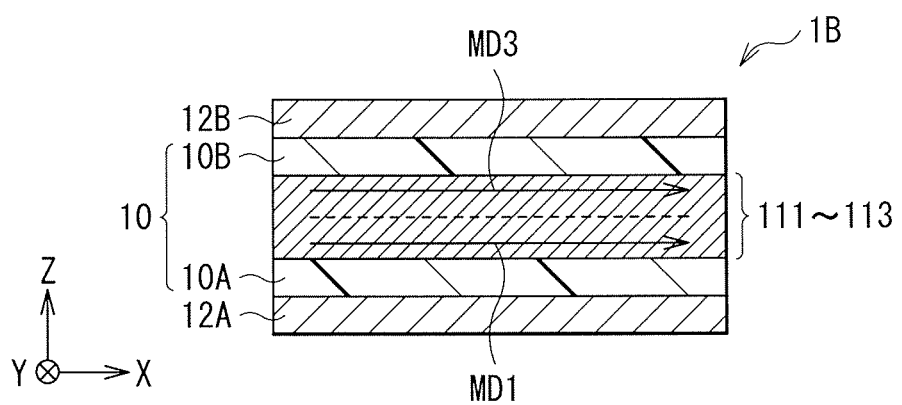
FIG. 14B is another schematic cross-sectional view for explaining a function of the polymer device illustrated in FIG. 13.

Thereby, in the polymer device 1B, in the lamination plane (the X-Y plane), a direction in which deformation (curvature) is easily generated and a direction in which deformation (curvature) is less likely to be generated are allowed to be individually defined. Specifically, for example, as illustrated in FIG. 14A, in a Y-Z cross section, the respective low expansion-contraction suppression directions in the expansion-contraction suppression layers 111 and 113 as the outside layers are along the Y-axis direction; however, on the other hand, the high expansion-contraction suppression direction MD2 in the expansion-contraction suppression layer 112 as the middle layer is along the Y-axis direction. Therefore, the electrode layers 12A and 12B are easily deformed along the Y-axis direction relatively. In contrast, for example, as illustrated in FIG. 14B, in a Z-X cross section, the high expansion-contraction suppression directions MD1 and MD3 in the expansion-contraction suppression layers 111 and 113 as the outside layers are along the X-axis direction, while the low expansion-contraction suppression direction in the expansion-contraction suppression layer 112 as the middle layer is along the X-axis direction. Therefore, the electrode layers 12A and 12B are less likely to be deformed along the X-axis direction relatively.

As described above, in this modification, similar effects are also obtainable basically by a function similar to that of the foregoing embodiment, and a direction in which deformation is easily generated and a direction in which deformation is less likely to be generated in the lamination plane are allowed to be individually defined.

[Modifications 3 and 4]

Figure 15:
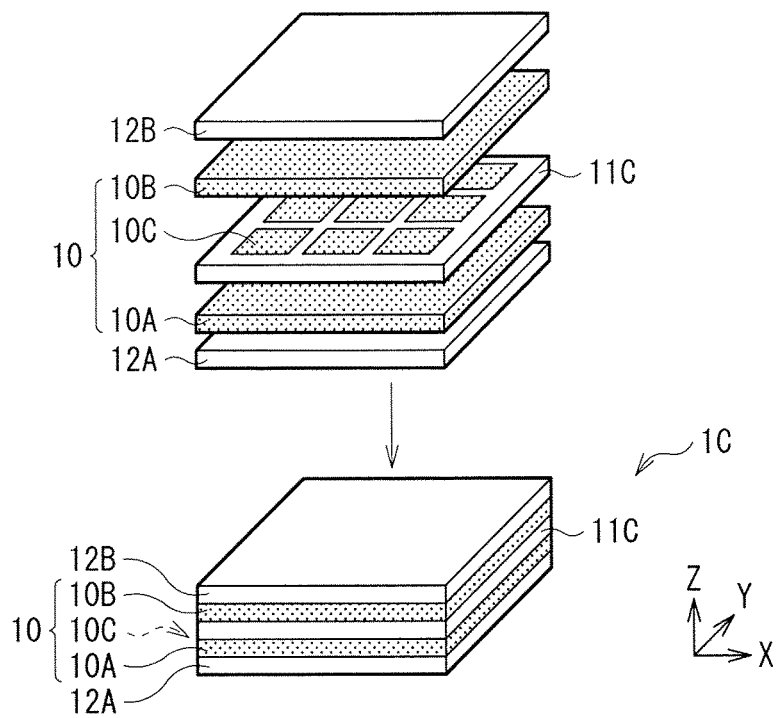
FIG. 15 is a perspective view schematically illustrating a configuration example of the polymer device according to Modification 3.
Figure 16:
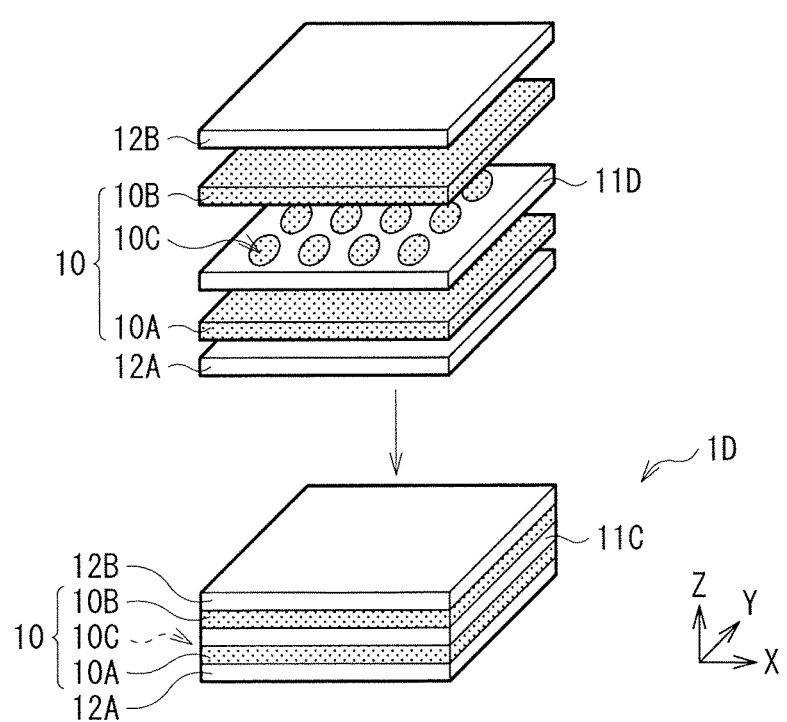
FIG. 16 is a perspective view schematically illustrating a configuration example of a polymer device according to Modification 4.

FIG. 15 schematically illustrates a configuration example of a polymer device (a polymer device 1C) according to Modification 3 by a perspective view and an exploded perspective view. Further, FIG. 16 schematically illustrates a configuration example of a polymer device (a polymer device 1D) according to Modification 4 by a perspective view and an exploded perspective view. In the polymer devices 1C and 1D, expansion-contraction suppression layers 11C and 11D are each arranged only in part of the formation region (in the X-Y plane) of the polymer layer 10, unlike the polymer devices 1, 1A, and 1B described above. For the other configurations, the polymer devices 1C and 1D have configurations similar to those of the polymer device 1 basically.

Specifically, in the polymer device 1C illustrated in FIG. 15, in the formation region of the polymer layer 10, the expansion-contraction suppression layer 11C is arranged in a lattice pattern as a whole. In other words, in the expansion-contraction suppression layer 11C, a plurality of rectangle openings are formed in a matrix pattern as a whole. As described above, the expansion-contraction suppression layer 11C is partially arranged substantially isotropically in the formation region of the polymer layer 10.

Further, in the polymer device 1D illustrated in FIG. 16, in the formation region of the polymer layer 10, the expansion-contraction suppression layer 11D is arranged in a net-like pattern as a whole. In other words, in the expansion-contraction suppression layer 11C, a plurality of circular openings are formed two-dimensionally as a whole. As described above, the expansion-contraction suppression layer 11D is partially arranged substantially isotropically in the formation region of the polymer layer 10.

As described above, in this modification, similar effects are also obtainable basically by a function similar to that of the foregoing embodiment, and the following effect is also obtainable. That is, since the expansion-contraction suppression layers 11C and 11D are respectively arranged only in part of the formation region of the polymer layer 10, ions in the polymer layer 10 are allowed to be easily conducted.

[Modification 5]

Figure 17:
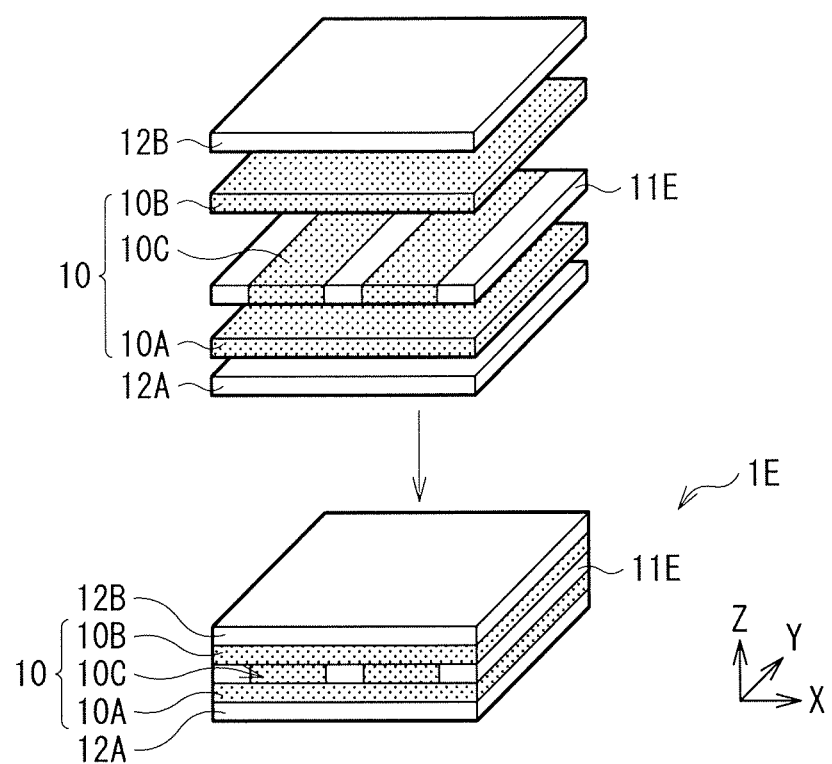
FIG. 17 is a perspective view schematically illustrating a configuration example of a polymer device according to Modification 5.

FIG. 17 schematically illustrates a configuration example of a polymer device (a polymer device 1E) according to Modification 5 by a perspective view and an exploded perspective view. As in the foregoing Modifications 3 and 4, in the polymer device 1E of this modification, an expansion-contraction suppression layer 11E is also arranged only in part of the formation region (in the X-Y plane) of the polymer layer 10. It is to be noted that, for the other configurations, the polymer device 1E has configurations similar to those of the polymer device 1 basically.

However, unlike the polymer devices 1C and 1D, in the polymer device 1E, the expansion-contraction suppression layer 11E has an anisotropic shape (in this example, rectangular shape) extending along a predetermined direction (in this example, in the Y-axis direction) in the formation region of the polymer layer 10. That is, in the formation region of the polymer layer 10, the expansion-contraction suppression layer 11E extending along the Y-axis direction and a region (a polymer layer 10C) in which the expansion-contraction suppression layer 11E is not arranged are alternately arranged along the X-axis direction, and a stripe pattern is formed as a whole.

Due to the foregoing configuration, in the polymer device 1E, effects similar to those of the foregoing embodiment are also obtainable basically by a function similar to that of the foregoing embodiment, and the following effect is also obtainable. That is, as in the foregoing Modification 2, in the formation plane (the X-Y plane) of the polymer layer 10, a direction (in this case, the X-axis direction) in which deformation is easily generated and a direction (in this case, the Y-axis direction) in which deformation is less likely to be generated are allowed to be individually defined.

APPLICATION EXAMPLES

Subsequently, description will be given of application examples (examples of application to imaging units: Application examples 1 and 2) of the polymer devices according to the foregoing embodiment and Modifications 1 to 5.

Application Example 1

Configuration of Mobile Phone 8

Figure 18:
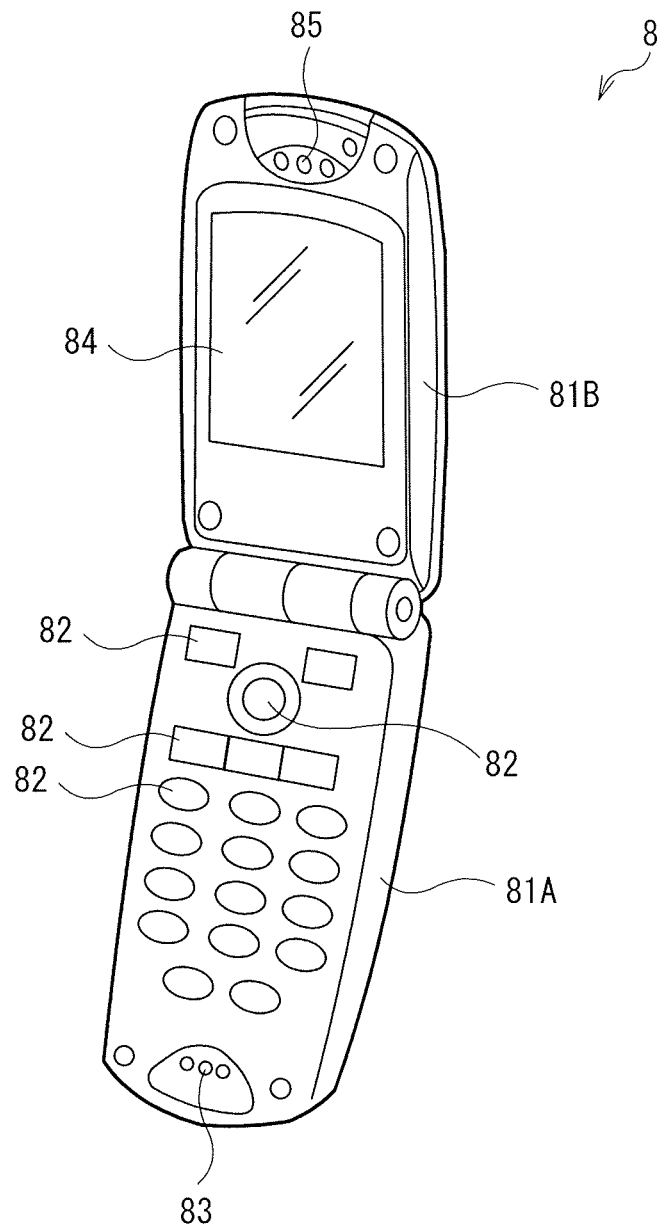
FIG. 18 is a perspective view illustrating a configuration example of a mobile phone as an electronic apparatus according to Application example 1.
Figure 19:
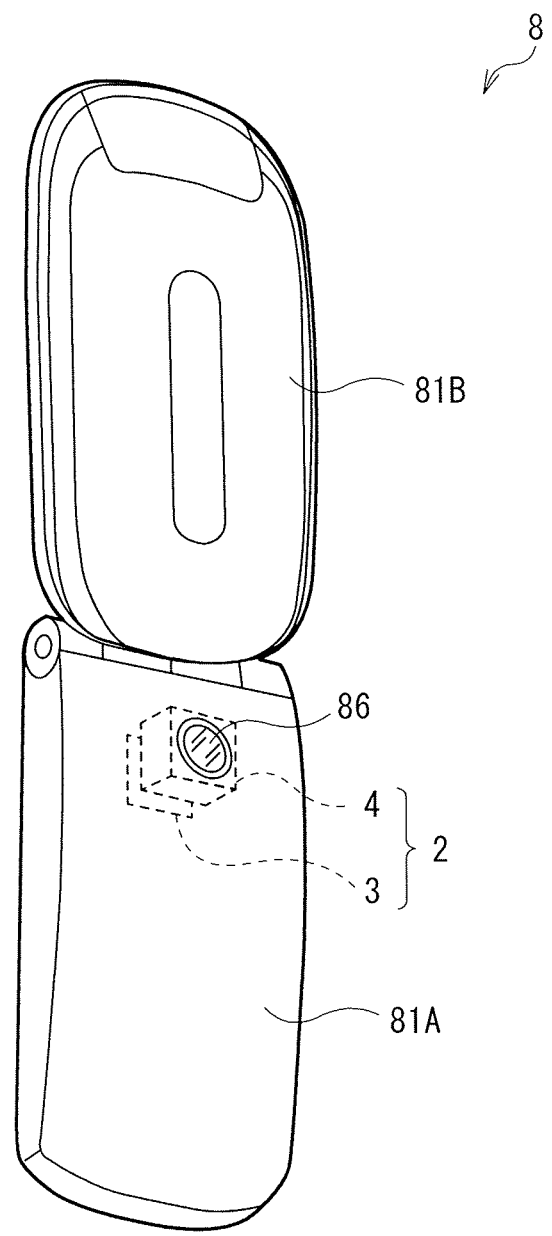
FIG. 19 is a perspective view of the mobile phone illustrated in FIG. 18 that is viewed from a different direction.

FIG. 18 and FIG. 19 illustrate schematic configurations of a mobile phone (a mobile phone 8) with an imaging function as an example of an electronic unit including an imaging unit according to Application example 1 of the polymer devices according to the foregoing embodiment and the like by perspective views. In the mobile phone 8, two package bodies 81A and 81B are linked foldably with an unillustrated hinge mechanism in between.

As illustrated in FIG. 18, a plurality of various operation keys 82 are arranged on the surface on one side of the package body 81A, and a microphone 83 is arranged in the lower end thereof. The operation keys 82 are used to input information upon receiving a predetermined operation by a user. The microphone 83 is used to input voice of a user at the time of telephone call and the like.

As illustrated in FIG. 18, a display section 84 formed of a liquid crystal display panel or the like is arranged on the surface on one side of the package body 81B, and a speaker 85 is arranged in the upper end thereof. On the display section 84, for example, various types of information such as a radio reception state, a remaining battery level, telephone number of a calling party, contents (telephone number, name, and the like of the other end) registered as a telephone book, a calling track record, and a received call track record are displayed. The speaker 85 is used to output voice and the like of a calling party at the time of a telephone call and the like.

As illustrated in FIG. 19, a cover glass 86 is arranged on the surface on the other side of the package body 81A, and an imaging unit 2 is provided on a position corresponding to the cover glass 86 inside the package body 81A. The imaging unit 2 includes a lens module 4 arranged on the object side (on the cover glass 86 side) and an imaging device 3 arranged on the image side (on the internal side of the package body 81A). The imaging device 3 is a device to obtain an imaging signal of an image formed by a lens (an after-described lens 40) in the lens module 4. For example, the imaging device 3 may be configured of an image sensor mounted with a device such as a charge coupled device (CCD) and a complementary metal oxide semiconductor (CMOS).

[Configuration of Imaging Unit 2]

Figure 20:
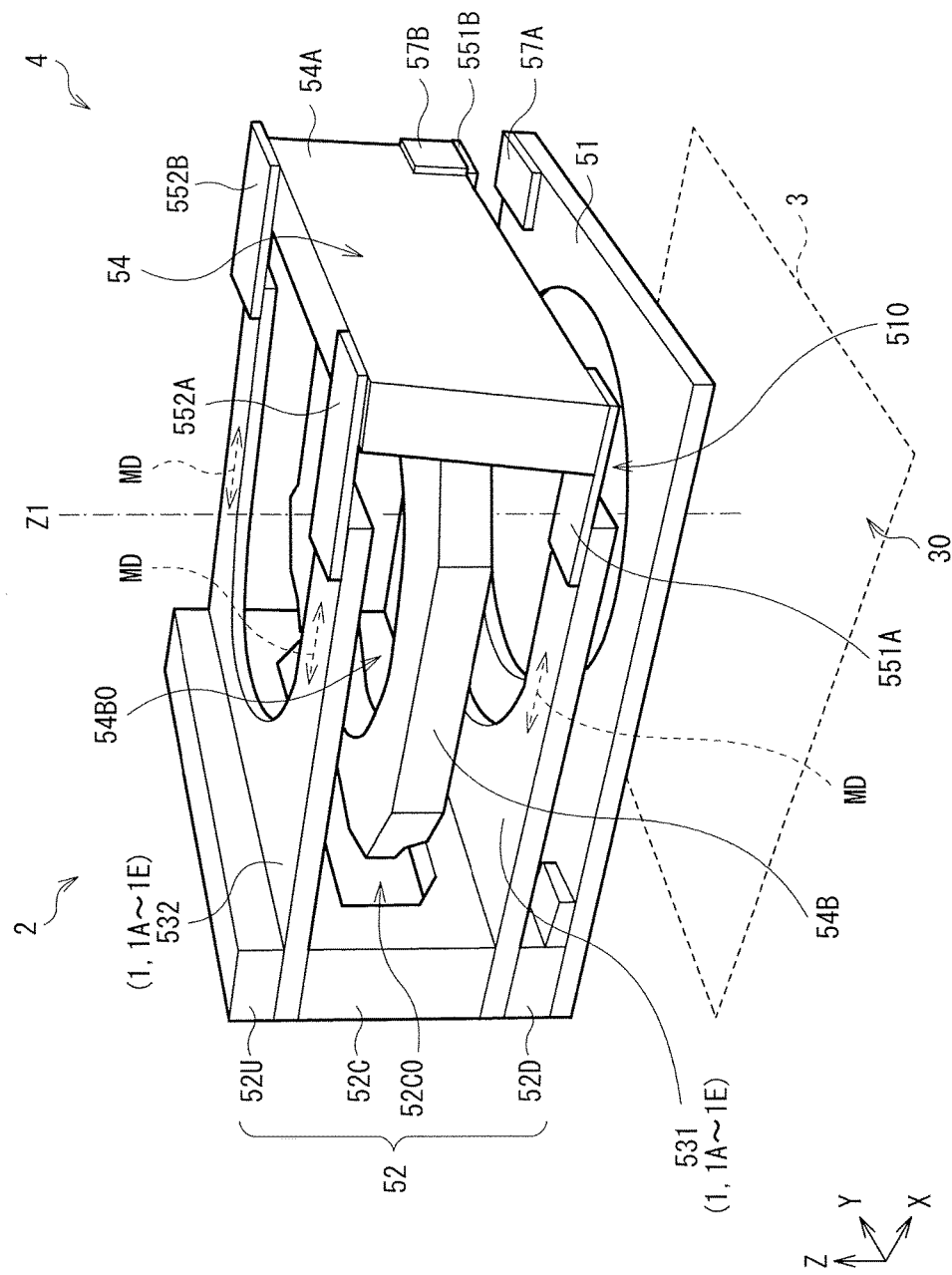
FIG. 20 is a perspective view illustrating a schematic configuration example of an imaging unit illustrated in FIG. 19.
Figure 21:
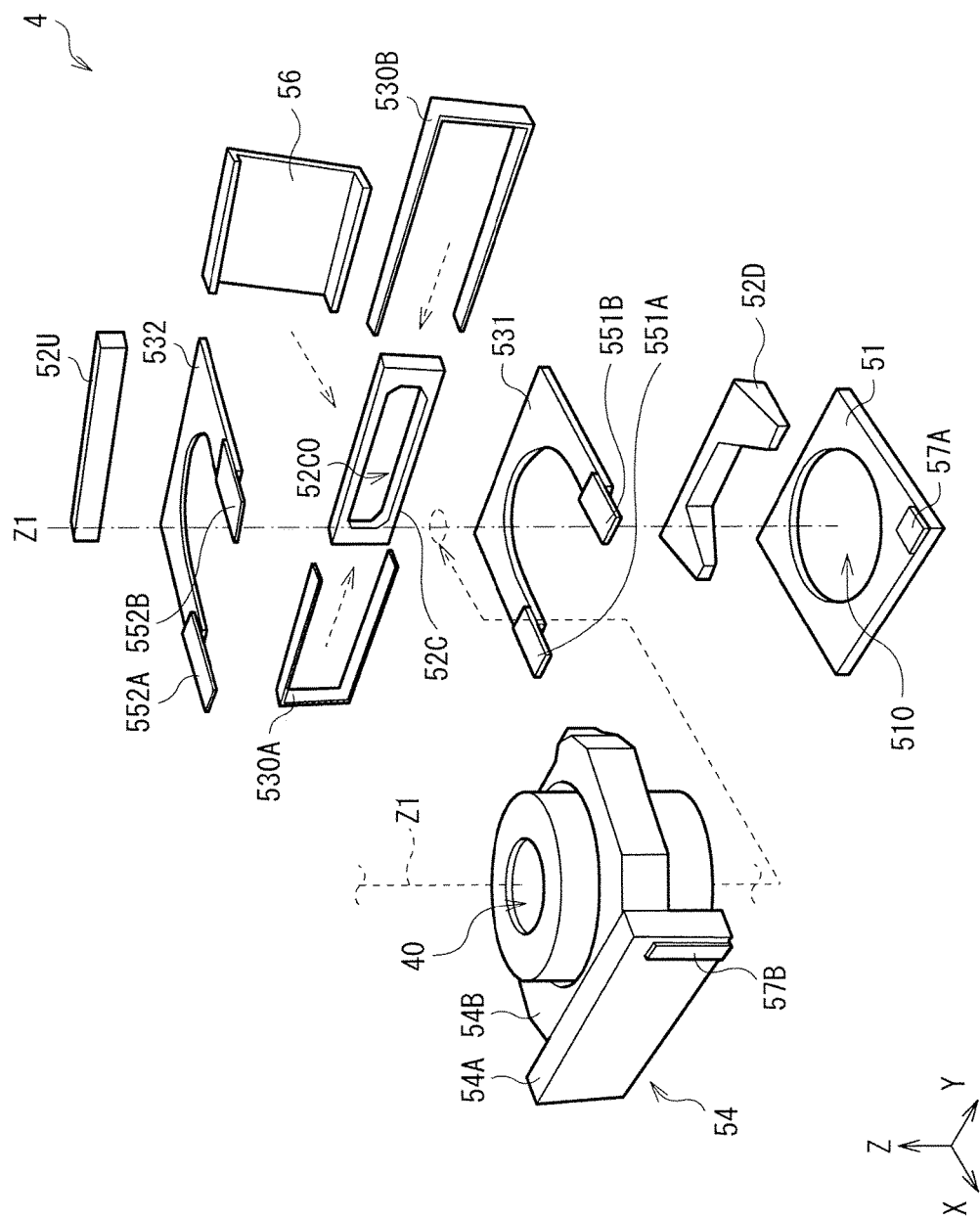
FIG. 21 is an exploded perspective view illustrating a configuration example of a lens module illustrated in FIG. 20.

FIG. 20 illustrates a schematic configuration example of the imaging unit 2 by a perspective view. FIG. 21 illustrates a configuration of the lens module 4 in the imaging unit 2 by an exploded perspective view.

The lens module 4 includes a support member 51, a polymer actuator device 531, a lens support member 54, the lens 40, and a polymer actuator device 532 in order from the image side (on an imaging surface 30 side of the imaging device 3) to the object side along an optical axis Z1 (along the positive direction on the Z axis). It is to be noted that, in FIG. 20, the lens 40 is not illustrated. The lens module 4 further includes a fixing member 52, linking members 551A, 551B, 552A, and 552B, fixed electrodes 530A and 530B, a presser member 56, and hall devices 57A and 57B. It is to be noted that, out of the foregoing members of the lens module 4, the members other than the lens 40 correspond to a specific example of "drive unit being configured to drive the lens" (a lens drive unit) in the present disclosure.

The support member 51 is a base member (a base) to support the whole lens module 4.

The fixing member 52 is a member for fixing each end of the polymer actuator devices 531 and 532. The fixing member 52 includes three members configured of a lower fixing member 52D, a central (middle) fixing member 52C, and an upper fixing member 52U that are arranged from the image side (the lower side of FIG. 12 and FIG. 13) to the object side (the upper side). One end of the polymer actuator device 531 and each one end of the fixed electrodes 530A and 530B are sandwiched between the lower fixing member 52D and the central fixing member 52C. On the other hand, one end of the polymer actuator device 532 and each of the other ends of the fixed electrodes 530A and 530B are sandwiched between the central fixing member 52C and the upper fixing member 52U. Further, in the central fixing member 52C out of those members, an opening 52C0 for partially tucking down part of the lens support member 54 (part of an after-described support section 54B) is formed. Thereby, part of the lens support member 54 is movable through the opening 52C0, and therefore, space is effectively used, and the lens module 4 is allowed to be miniaturized.

The fixed electrodes 530A and 530B are electrodes for supplying a driving voltage Vd (FIG. 22A and FIG. 22B) from an after-described voltage supply section 59 to electrode layers (the above-described electrode layers 12A and 12B) in the polymer actuator devices 531 and 532. The fixed electrodes 530A and 530B may each be made, for example, of gold (Au), metal plated with gold, or the like, and have a U-like shape. Thereby, the respective fixed electrodes 530A and 530B sandwich the top and the bottom (both side surfaces along the Z axis) of the central fixing member 52C, and thereby, the same voltage is applicable in parallel to the pair of polymer actuator devices 531 and 532 with a small number of wirings. Further, in the case where the fixed electrodes 530A and 530B are made of a metal material plated with gold, degradation of contact resistance by oxidation of the surface or the like is allowed to be prevented.

The lens support member 54 is a member for supporting the lens 40, and may be made, for example, of a rigid resin material such as a liquid crystal polymer. The lens support member 54 is arranged so that the center thereof is located on the optical axis Z1. The lens support member 54 includes the circular support section 54B to support the lens 40 and a connection section 54A that supports the support section 54B and connects the support section 54B to the after-described linking members 551A, 551B, 552A, and 552B. Further, the support section 54B is arranged between after-described drive surfaces in the pair of polymer actuator devices 531 and 532.

Each of the polymer actuator devices 531 and 532 has a drive surface (a drive surface on the X-Y plane) perpendicular to the optical axis Z1 of the lens 40. The drive surfaces are arranged to be opposed to each other along the optical axis Z1. The respective polymer actuator devices 531 and 532 are configured to drive the lens support member 54 (and the lens 40) along the optical axis Z1 through the after-described linking members 551A, 551B, 552A, and 552B. Further, the respective polymer actuator devices 531 and 532 are configured with the use of any of the polymer devices 1 and 1A to 1E according to the foregoing embodiment and the like.

As illustrated in FIG. 20, the respective polymer actuator devices 531 and 532 have anisotropic shapes extending along a predetermined direction (in this example, in the X-axis direction). The high expansion-contraction suppression direction MD in the expansion-contraction suppression layer 11 and the like of the polymer actuator devices 531 and 532 is substantially equal to the foregoing predetermined direction (the extension direction of the anisotropic shape) (in this case, both are the X-axis direction). Thereby, in the formation surface of the polymer layer 10 (the X-Y plane), a direction in which dimensions of the polymer layer 10 are less likely to be changed (a direction in which expansion-contraction suppression function is relatively large: in this case, the X-axis direction) is allowed to be defined. Therefore, in this example, the following effect is obtained. That is, in this case, in the case where the polymer layer 10 is extended particularly in the X-axis direction, the position of the lens 40 is displaced. In addition thereto, in the case where a gap between the lens support member 54 and a surrounding wall is small, the lens support member 54 may interfere with the surrounding wall due to change in dimensions of the polymer layer 10. Therefore, as described above, by defining the direction in which dimensions of the polymer layer 10 are less likely to be changed relatively, to the X-axis direction, the foregoing trouble is allowed to be avoided. It is to be noted that, in this example, even if the polymer layer 10 is extended in the Y-axis direction, it is less likely to have adverse effect.

Further, as illustrated in FIG. 21, in the polymer actuator device 531, for example, the electrode layer 52A may be electrically connected to the fixed electrode 530B on the lower fixing member 52D side, and the electrode layer 52B may be electrically connected to the fixed electrode 530A on the central fixing member 52C side. On the other hand, in the polymer actuator device 532, for example, the electrode layer 52A may be electrically connected to the fixed electrode 530A on the central fixing member 52C side, and the electrode layer 52B may be electrically connected to the fixed electrode 530B on the upper fixing member 52U side. Further, the respective members and the respective electrodes from the fixed electrode 530B on the lower fixing member 52D side to the fixed electrode 530B on the upper fixing member 52U side are fixed by being tucked down by a presser member 46 (a plate spring). Thereby, the polymer actuator devices 531 and 532 are not destroyed even if large force is applied thereto, and electrical connection is stably achieved even if the polymer actuator devices 531 and 532 are deformed.

Each of the linking members 551A, 551B, 552A, and 552B is a member for linking (connecting) each other end of the polymer actuator devices 531 and 532 to an end of the connection section 54A. Specifically, each of the linking members 551A and 551B links the lower end portion of the connection section 54A to the other end of the polymer actuator device 531, and each of the linking members 552A and 552B links the upper end portion of the connection section 54A to the other end of the polymer actuator device 532. Each of the linking members 551A, 551B, 552A, and 552B may be made, for example, of a flexible film such as a polyimide film. Each of the linking members 551A, 551B, 552A, and 552B may be preferably made of a flexible material having rigidity (bending rigidity) equivalent to or less than (preferably the same as or less than) those of the respective polymer actuator devices 531 and 532. Thereby, freedom degree that the linking members 551A, 551B, 552A, and 552B are curved in the opposite direction of the curvature direction of the polymer actuator devices 531 and 532 is created. Therefore, the cross-sectional shape in a cantilever configured of the polymer actuator devices 531 and 532 and the linking members 551A, 551B, 552A, and 552B curves in an S-like shape. As a result, the connection section 54A is allowed to be translated in parallel along the Z-axis direction, and the support section 54B (and the lens 40) is driven in the Z-axis direction while being in parallel with the support member 51. It is to be noted that, as the foregoing rigidity (the bending rigidity), for example, spring constant may be used.

[Operation of Lens Module 4]

Figure 22A:
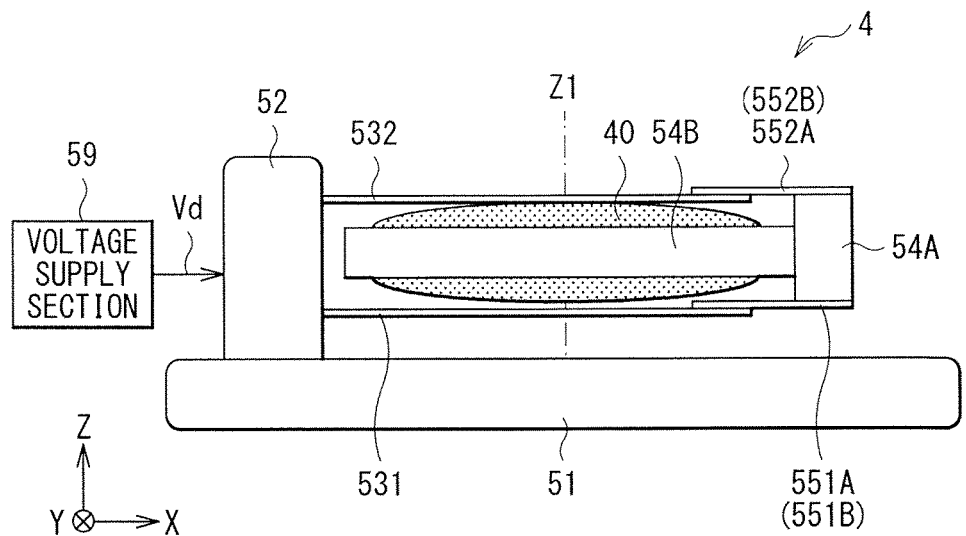
FIG. 22A is a schematic view for explaining an operation example of the lens module illustrated in FIG. 20.
Figure 22B:
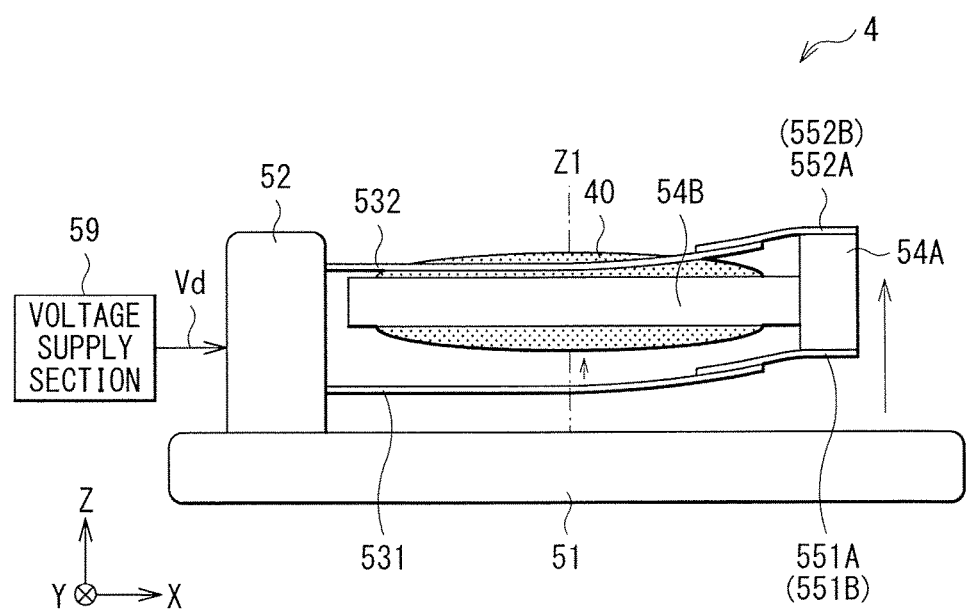
FIG. 22B is another schematic view for explaining an operation example of the lens module illustrated in FIG. 20.

FIG. 22A and FIG. 22B each illustrate a schematic configuration example of the lens module 4 by side views (Z-X side views) schematically. FIG. 22A illustrates a state before operation, and FIG. 22B illustrates a state after the operation.

In the lens module 4, when the driving voltage Vd is supplied from the voltage supply section 59 to the polymer actuator devices 531 and 532, each of the other end sides of the polymer actuator devices 531 and 532 is curved along the Z-axis direction based on the foregoing principle. Thereby, the lens support member 54 is driven by the polymer actuator devices 531 and 532, and the lens 40 is allowed to travel along the optical axis Z1 thereof (see the arrow in FIG. 22B). As described above, in the lens module 4, the lens 40 is driven along the optical axis Z1 thereof by the drive unit (the lens drive unit) using the polymer actuator devices 531 and 532. That is, the lens 40 in the lens module 4 travels along the optical axis Z1 thereof, and thereby, a focusing operation and a zooming operation are performed.

Application Example 2

Subsequently, description will be given of an imaging unit (a camera module) according to Application example 2 of the polymer devices according to the foregoing embodiment and the like. The imaging unit according to this application example is also built in the mobile phone 8 with an imaging function as illustrated in the above-described FIG. 18 and FIG. 19, for example. However, while the polymer device (the polymer actuator device) is used as a lens drive unit in the imaging unit 2 of Application example 1, the polymer device (the polymer actuator device) is used as a drive unit for driving an imaging device 3 in the imaging unit of this application example as described below.

[Configuration of Imaging Unit 2A]

Figure 23:
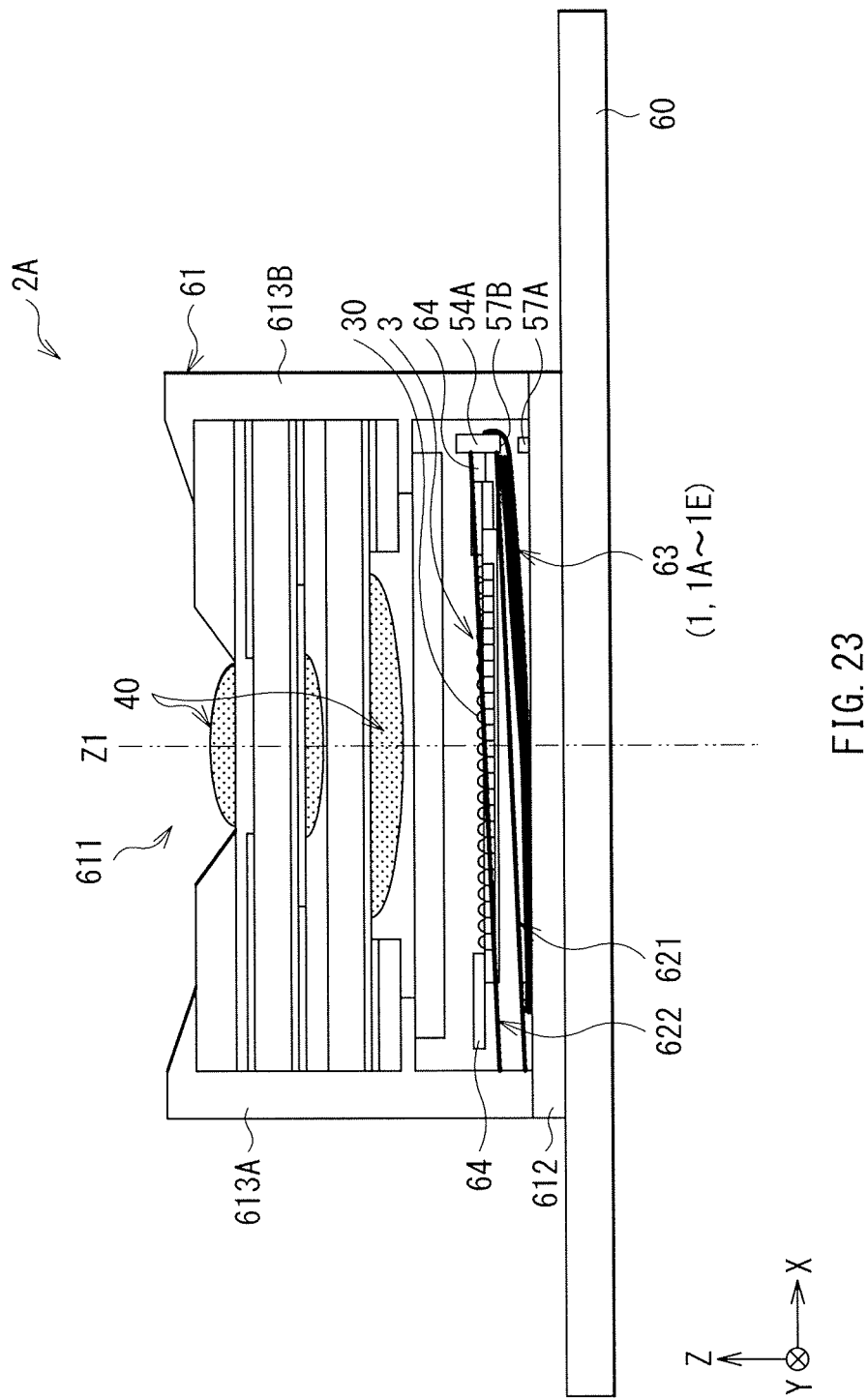
FIG. 23 is a side view illustrating a schematic configuration example of an imaging unit according to Application example 2.

FIG. 23 illustrates a schematic configuration example of an imaging unit (an imaging unit 2A) according to this application example by a side view (a Z-X side view). The imaging unit 2A includes a housing 61 for supporting various members on a substrate 60.

In the housing 61, an opening 611 for arranging the lens 40 is formed, and a pair of side wall sections 613A and 613B and a bottom section 612 located on the substrate 60 are provided. Each of one end sides of a pair of plate springs 621 and 622 is fixed onto the side wall section 613A. The imaging device 3 is arranged on each of the other end sides of the plate springs 621 and 622 with the connection section 54A and a support section 64 in between. Further, one end side of a polymer actuator device 63 is fixed onto the bottom section 612. The other end side of the polymer actuator device 63 is fixed onto the bottom surface of the support section 64. It is to be noted that the hall device 57A is also arranged on the bottom section 612, and the hall device 57B is arranged on a position opposed to the hall device 57A on the connection section 54A.

It is to be noted that, out of the foregoing members of the imaging unit 2A, the bottom section 612, the side wall section 613A, the plate springs 621 and 622, the polymer actuator device 63, the support section 64, and the connection section 54A mainly correspond to a specific example of "drive unit being configured to drive the imaging device" (a drive unit for an imaging device) in the present disclosure.

As described above, the polymer actuator device 63 is configured to drive the imaging device 3, and is configured using any of the polymer devices 1 and 1A to 1E according to this embodiment or the like.

The polymer actuator device 63 also has an anisotropic shape extending along a predetermined direction (in this example, along the X-axis direction). Although not illustrated in FIG. 23, the high expansion-contraction suppression direction MD in the expansion-contraction suppression layer 11 and the like of the polymer actuator device 63 is substantially equal to the foregoing predetermined direction (the extension direction of the anisotropic shape) (in this case, both are the X-axis direction). Therefore, also in this application example, a direction in which dimensions of the polymer layer 10 are less likely to be changed (in this case, the X-axis direction) is allowed to be defined as well, and an effect similar to that of the foregoing Application example 1 is obtained.

[Operation of Imaging Unit 2A]

Figure 24A:
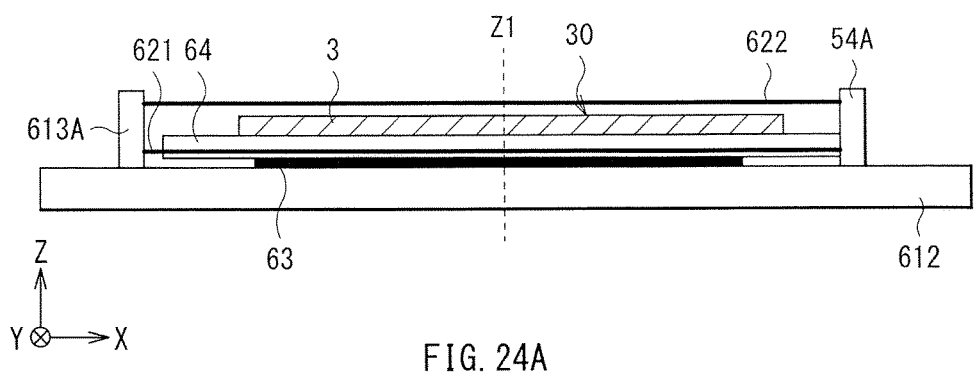
FIG. 24A is a schematic view for explaining an operation example of the imaging unit illustrated in FIG. 23.
Figure 24B:
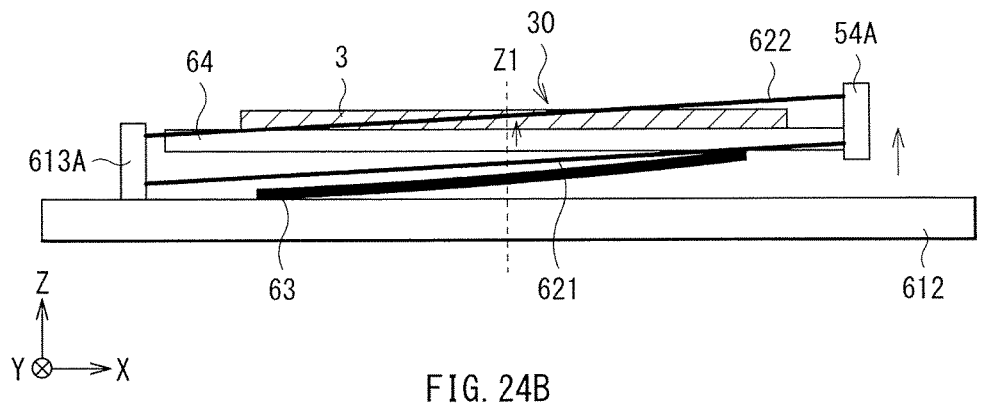
FIG. 24B is another schematic view for explaining an operation example of the imaging unit illustrated in FIG. 23.

FIG. 24A and FIG. 24B each illustrate part of the imaging unit 2A (the foregoing drive unit for the imaging device) by side views (Z-X side views) schematically. FIG. 24A illustrates a state before operation, and FIG. 24B illustrates a state after the operation.

In the imaging unit 2A, when the driving voltage Vd is supplied from a voltage supply section (not illustrated) to the polymer actuator device 63, the other end side of the polymer actuator device 63 is curved along the Z-axis direction based on the foregoing principle. Thereby, the connection section 54A is driven by the polymer actuator device 63, and the imaging device 3 becomes movable along the optical axis Z1 of the lens 40 (see the arrow in FIG. 24B). As described above, in the imaging unit 2A, the imaging device 3 is driven along the optical axis Z1 of the lens 40 by the drive unit (the drive device for an imaging device) using the polymer actuator device 63. Accordingly, a relative distance between the lens 40 and the imaging device 3 is changed, and thereby, focusing and zooming are performed.

[Other Modifications]

While the present application has been described with reference to the embodiment, the modifications, and the application examples, the present application is not limited to the foregoing embodiment and the like, and various modifications may be made.

For example, in the foregoing embodiment and the like, the description has been given of the case in which the expansion-contraction suppression layer is arranged in the vicinity of the center in the thickness direction in the polymer layer 10. However, the configuration thereof is not limited thereto. That is, for example, the separation distance d1A from the electrode layer 12A to the expansion-contraction suppression layer and the separation distance d1B from the electrode layer 12B to the expansion-contraction suppression layer may not be equal to each other (d1A<d1B or d1A>d1B) (vertically asymmetric structure). In other words, as long as the expansion-contraction suppression layer is located between the pair of electrode layers 12A and 12B and is arranged away from the respective electrode layers 12A and 12B, the expansion-contraction suppression layer may be arranged in a location other than the vicinity of the center in the thickness direction in the polymer layer 10.

Further, shapes, materials, and the like of the polymer device and other members in the imaging unit are not limited to those described in the foregoing embodiment and the like. Further, a laminated structure of the polymer device is not limited to those described in the foregoing embodiment and the like, and modifications may be made as appropriate.

In addition thereto, in the foregoing embodiment and the like, the description has been given of the case in which the polymer device is configured as a polymer actuator device or a polymer sensor device as an example. However, applications are not limited thereto. That is, the polymer device of the present disclosure is applicable also to other devices such as an electric double layer capacitor.

Further, in the foregoing embodiment and the like, the description has been mainly given of the lens drive unit that drives a lens as a driving targe along the optical axis thereof as an example of the drive unit of the present disclosure. However, examples are not limited thereto. For example, the lens drive unit may drive the lens along a direction orthogonal to the optical axis thereof. Further, the drive unit of the present disclosure is applicable to a drive unit to drive other driving target such as a diaphragm (see Japanese Unexamined Patent Application Publication No. 2008-259381, etc.) and the like other than the foregoing lens drive unit and the drive unit for an imaging device. Further, the drive unit, the lens module, and the imaging unit of the present disclosure are applicable to various electronic apparatuses other than the mobile phone described in the foregoing embodiment.

It is possible to achieve at least the following configurations from the above-described example embodiments and the modifications of the disclosure.

(1) A polymer device including:
　a pair of electrode layers;
　a polymer layer inserted between the pair of electrode layers; and
　an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

(2) The polymer device according to (1), wherein the expansion-contraction suppression layer is arranged in vicinity of a center in a thickness direction in the polymer layer.

(3) The polymer device according to (2), wherein a separation distance from one electrode layer of the pair of electrode layers to the expansion-contraction suppression layer is substantially equal to a separation distance from the other electrode layer of the pair of electrode layers to the expansion-contraction suppression layer.

(4) The polymer device according to any one of (1) to (3), wherein the expansion-contraction suppression layer has ion conductivity.

(5) The polymer device according to (4), wherein the expansion-contraction suppression layer is configured of ion conductive resin and one of a fibrous film and a porous film.

(6) The polymer device according to any one of (1) to (5), wherein the expansion-contraction suppression layer is arranged in part or all of a formation region of the polymer layer.

(7) The polymer device according to (6), wherein the expansion-contraction suppression layer is arranged in part of the formation region of the polymer layer and is arranged substantially isotropically.

(8) The polymer device according to (6), wherein the expansion-contraction suppression layer has an anisotropic shape extending along a predetermined direction in the formation region of the polymer layer.

(9) The polymer device according to any one of (1) to (8), wherein
　the expansion-contraction suppression layer is configured of a laminated structure including a plurality of layers, and
　a plurality of types of high expansion-contraction suppression directions are provided in the laminated structure as a whole, the plurality of types of the high expansion-contraction suppression directions each having a relatively-large expansion-contraction suppression function.

(10) The polymer device according to (9), wherein the plurality of types of the high expansion-contraction suppression directions are substantially isotropic as a whole.

(11) The polymer device according to (9), wherein
　the laminated structure is configured of three or more layers, and
　an outside layer in the laminated structure has the high expansion-contraction suppression direction that is different from the high expansion-contraction suppression direction of a middle layer in the laminated structure.

(12) The polymer device according to any one of (1) to (11), wherein
　the polymer device has an anisotropic shape extending along a predetermined direction, and
　a high expansion-contraction suppression direction having a relatively-large expansion-contraction suppression function in the expansion-contraction suppression layer is substantially equal to the predetermined direction.

(13) The polymer device according to any one of (1) to (12), wherein the expansion-contraction suppression layer suppresses expansion and contraction in an in-layer direction in the polymer layer.

(14) The polymer device according to (13), wherein the expansion-contraction suppression layer has lower linear expansion coefficient and higher Young's modulus compared to the polymer layer.

(15) The polymer device according to any one of (1) to (14), wherein the polymer device is configured as one of a polymer actuator device and a polymer sensor device.

(16) The polymer device according to (15), wherein the polymer actuator device drives one of a lens and an imaging device.

(17) A lens module including:
　a lens; and
　a drive unit configured with use of a polymer device, and the drive unit being configured to drive the lens,
　the polymer device including
　　a pair of electrode layers,
　　a polymer layer inserted between the pair of electrode layers, and
　　an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

(18) An imaging unit including:
　a lens;
　an imaging device configured to obtain an imaging signal of an image formed by the lens; and
　a drive unit configured with use of a polymer device, and the drive unit being configured to drive one of the lens and the imaging device,
　the polymer device including
　　a pair of electrode layers,
　　a polymer layer inserted between the pair of electrode layers, and
　　an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer.

(19) A method of manufacturing a polymer device, the method including:
　forming a pair of electrode layers;
　providing a polymer layer between the pair of electrode layers; and
　arranging an expansion-contraction suppression layer between the pair of electrode layers and away from the respective electrode layers, the expansion-contraction suppression layer being configured to suppress expansion and contraction of the polymer layer.

(20) The method according to (19), wherein the expansion-contraction suppression layer is formed by impregnating one of a fibrous film and a porous film with ion conductive resin.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A polymer device comprising:
a pair of electrode layers;
a polymer layer inserted between the pair of electrode layers; and
an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer,
wherein a thickness of the expansion-contraction suppression layer is one third or less of a laminated structure including the polymer layer and the expansion-contraction suppression layer and a distance from the expansion-contraction suppression layer to at least one of the pair of electrode layers is equal to or larger than 10 µm.

2. The polymer device according to claim 1, wherein the expansion-contraction suppression layer is arranged in vicinity of a center in a thickness direction in the polymer layer.

3. The polymer device according to claim 2, wherein a separation distance from one electrode layer of the pair of electrode layers to the expansion-contraction suppression layer is substantially equal to a separation distance from the other electrode layer of the pair of electrode layers to the expansion-contraction suppression layer.

4. The polymer device according to claim 1, wherein the expansion-contraction suppression layer has ion conductivity.

5. The polymer device according to claim 4, wherein the expansion-contraction suppression layer is configured of ion conductive resin and one of a fibrous film and a porous film.

6. The polymer device according to claim 1, wherein the expansion-contraction suppression layer is arranged in part or all of a formation region of the polymer layer.

7. The polymer device according to claim 6, wherein the expansion-contraction suppression layer is arranged in part of the formation region of the polymer layer and is arranged substantially isotropically.

8. The polymer device according to claim 6, wherein the expansion-contraction suppression layer has an anisotropic shape extending along a predetermined direction in the formation region of the polymer layer.

9. The polymer device according to claim 1, wherein
the expansion-contraction suppression layer is configured of a laminated structure including a plurality of layers, and
a plurality of types of expansion-contraction suppression directions are provided in the laminated structure as a whole.

10. The polymer device according to claim 9, wherein the plurality of types of the expansion-contraction suppression directions are substantially isotropic as a whole.

11. The polymer device according to claim 9, wherein
the laminated structure is configured of three or more layers, and
an outside layer in the laminated structure has the expansion-contraction suppression direction that is different from the expansion-contraction suppression direction of a middle layer in the laminated structure.

12. The polymer device according to claim 1, wherein
the polymer device has an anisotropic shape extending along a predetermined direction, and
a expansion-contraction suppression direction in the expansion-contraction suppression layer is substantially equal to the predetermined direction.

13. The polymer device according to claim 1, wherein the expansion-contraction suppression layer suppresses expansion and contraction in an in-layer direction in the polymer layer.

14. The polymer device according to claim 13, wherein the expansion-contraction suppression layer has lower linear expansion coefficient and higher Young's modulus compared to the polymer layer.

15. The polymer device according to claim 1, wherein the polymer device is configured as one of a polymer actuator device and a polymer sensor device.

16. The polymer device according to claim 15, wherein the polymer actuator device drives one of a lens and an imaging device.

17. A lens module comprising:
a lens; and
a drive unit configured with use of a polymer device, and the drive unit being configured to drive the lens,
the polymer device including
a pair of electrode layers,
a polymer layer inserted between the pair of electrode layers, and
an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer,
wherein a thickness of the expansion-contraction suppression layer is one third or less of a laminated structure including the polymer layer and the expansion-contraction suppression layer and a distance from the expansion-contraction suppression layer to at least one of the pair of electrode layers is equal to or larger than 10 µm.

18. An imaging unit comprising:
a lens;
an imaging device configured to obtain an imaging signal of an image formed by the lens; and
a drive unit configured with use of a polymer device, and the drive unit being configured to drive one of the lens and the imaging device, the polymer device including
a pair of electrode layers,
a polymer layer inserted between the pair of electrode layers, and
an expansion-contraction suppression layer arranged between the pair of electrode layers, the expansion-contraction suppression layer being arranged away from the respective electrode layers, and the expansion-contraction suppression layer being configured to suppress expansion and contraction of the polymer layer,
wherein a thickness of the expansion-contraction suppression layer is one third or less of a laminated structure including the polymer layer and the expansion-contraction suppression layer and a distance from the expansion-contraction suppression layer to at least one of the pair of electrode layers is equal to or larger than 10 µm.

19. The polymer device according to claim 1, wherein the expansion-contraction suppression layer includes an inorganic fiber.

20. The polymer device according to claim 1, wherein the expansion-contraction suppression layer is made of a material having linear expansion coefficient of a vale from $10 \times 10^{-6}$ to $50 \times 10^{-6}$ (/deg C.) both inclusive and the polymer layer is made of a material having linear expansion coefficient of about $100 \times 10^{-6}$ (/deg C.).

21. The polymer device according to claim 20, wherein the expansion-contraction suppression layer has an area expansion rate of a value from about 0 to 5% both inclusive, and the polymer layer has an area expansion rate of a value equal to or larger than 10%.

22. The polymer device according to claim 21, wherein the expansion-contraction suppression layer has a Young's modulus of a value from about 1 to 10 GPa both inclusive, and the polymer layer has a Young's modulus of a value from about 0.2 to 0.5 GPa both inclusive.

* * * * *